United States Patent
Park et al.

(10) Patent No.: US 12,095,009 B2
(45) Date of Patent: Sep. 17, 2024

(54) PIXEL AND DISPLAY DEVICE INCLUDING THE SAME

(71) Applicant: Samsung Display Co., Ltd., Yongin-si (KR)

(72) Inventors: Do Yeong Park, Yongin-si (KR); No Kyung Park, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 327 days.

(21) Appl. No.: 17/448,157

(22) Filed: Sep. 20, 2021

(65) Prior Publication Data

US 2022/0238757 A1 Jul. 28, 2022

(30) Foreign Application Priority Data

Jan. 26, 2021 (KR) ........................ 10-2021-0011063

(51) Int. Cl.
*H01L 33/38* (2010.01)
*H01L 27/15* (2006.01)
*H01L 33/62* (2010.01)

(52) U.S. Cl.
CPC .......... *H01L 33/382* (2013.01); *H01L 27/156* (2013.01); *H01L 33/62* (2013.01)

(58) Field of Classification Search
CPC ....... H01L 33/382; H01L 33/62; H01L 33/20; H01L 27/156; H01L 27/1214;
(Continued)

(56) References Cited

U.S. PATENT DOCUMENTS 7,999,290 B2 8/2011 Park
9,190,630 B2 11/2015 Kim et al.
(Continued)

FOREIGN PATENT DOCUMENTS

KR 10-2018-0009014 A 1/2018
KR 10-2018-0011404 A 2/2018
(Continued)

OTHER PUBLICATIONS

International Search Report dated Apr. 13, 2022, for corresponding PCT Application No. PCT/KR2021/020291 (3 pages).

*Primary Examiner* — Farun Lu
*Assistant Examiner* — Sandra Milena Rodriguez Villan
(74) *Attorney, Agent, or Firm* — Lewis Roca Rothgerber Christie LLP

(57) ABSTRACT

A display device may include a pixel. The pixel may include: an emission area, a non-emission area, and a split area spaced from the emission area with the non-emission area interposed therebetween; a first pattern and a second pattern spaced from each other in a first direction, and each extending in a second direction; a first light emitting element aligned between the first and second patterns; a first electrode connected to a first end of the first light emitting element; a second electrode connected to a second end of the first light emitting element; a bank located in the non-emission area and defining the emission area and the split area; and an insulating pattern located between the first and second electrodes and overlapping the first light emitting element. Only two of the first pattern, the bank, and the insulating pattern may overlap each other.

23 Claims, 20 Drawing Sheets

(58) Field of Classification Search
CPC ............... H01L 25/0753; H01L 25/167; H01L 2933/0066; H01L 23/535; H01L 23/522; H01L 21/768; H01L 2221/10
See application file for complete search history.

(56) References Cited

U.S. PATENT DOCUMENTS

| | | |
|---|---|---|
| 10,249,603 B2 | 4/2019 | Cho et al. |
| 10,276,630 B2 | 4/2019 | Lee et al. |
| 10,340,419 B2 | 7/2019 | Kim et al. |
| 2018/0175104 A1* | 6/2018 | Kang .................... H01L 33/005 |
| 2022/0052032 A1 | 2/2022 | Li et al. |
| 2022/0068901 A1 | 3/2022 | Kong et al. |

FOREIGN PATENT DOCUMENTS

| | | | |
|---|---|---|---|
| KR | 10-1978783 B1 | 5/2019 | |
| KR | 10-2019-0062808 A | 6/2019 | |
| KR | 10-1987196 B1 | 6/2019 | |
| KR | 10-2020-0042075 A | 4/2020 | |
| KR | 10-2020-0070493 A | 6/2020 | |
| KR | 10-2020-0073340 A | 6/2020 | |
| WO | WO-2020013386 A1 * | 1/2020 | ......... H01L 25/0753 |

\* cited by examiner

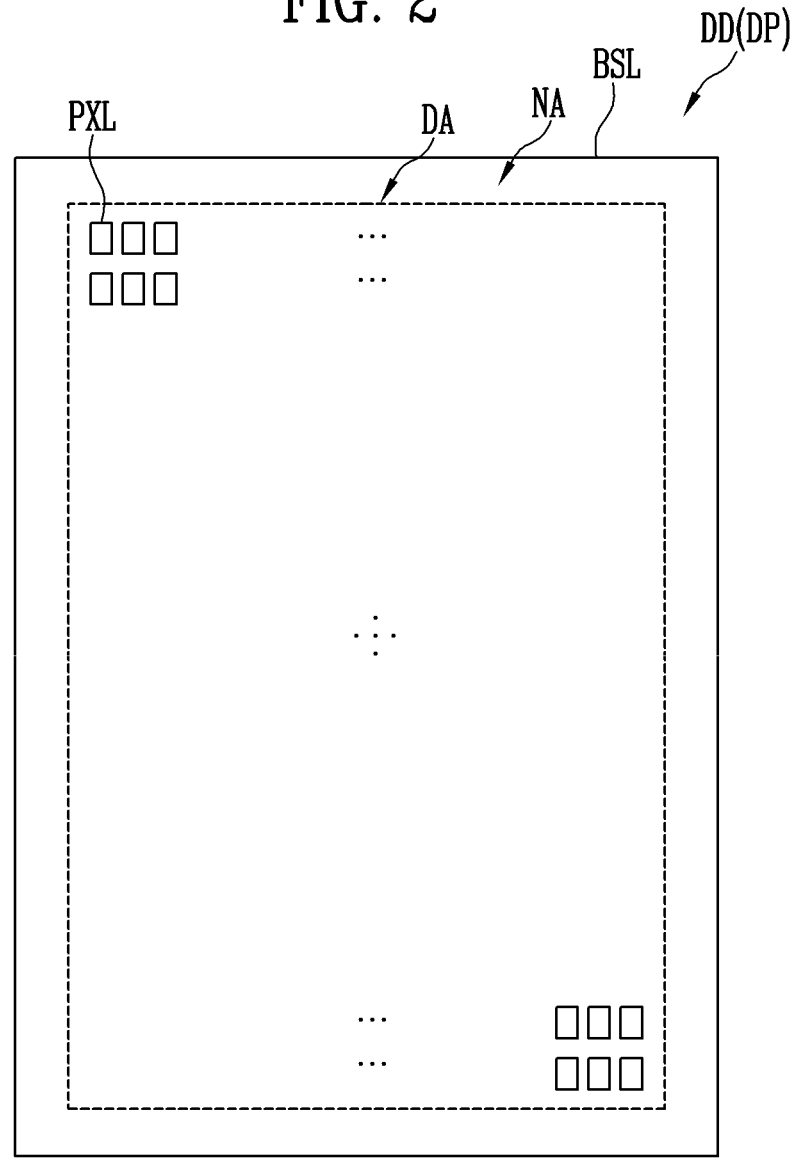

INS2: INS2-1, INS2-2, INS2-3

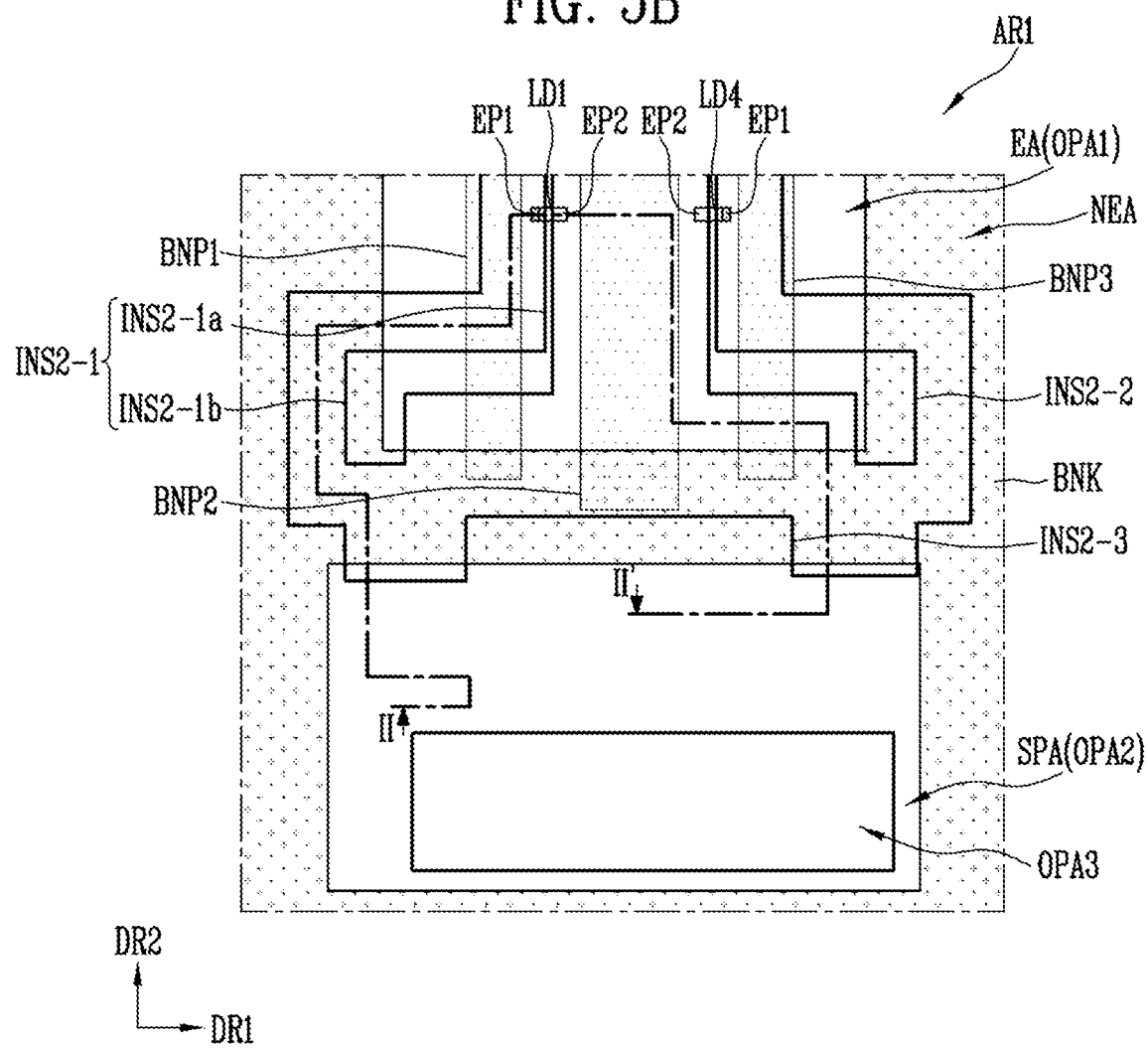

INS2_1: INS2_1a, INS2_1b, INS2_1c, INS2_1d

PIXEL AND DISPLAY DEVICE INCLUDING THE SAME

CROSS-REFERENCE TO RELATED APPLICATION

This application claims priority to and the benefit of Korean patent application number 10-2021-0011063, filed on Jan. 26, 2021, in the Korean Intellectual Property Office, the entire disclosure of which is incorporated herein by reference.

BACKGROUND

1. Field

Various embodiments of the present disclosure relate to a pixel and a display device including the pixel.

2. Description of Related Art

Recently, interest in information displays is increasingly growing. Hence, research and development on display devices have been continuously performed.

SUMMARY

Various embodiments of the present disclosure are directed to a pixel and a display device including the pixel capable of preventing an open defect of pixel electrodes from occurring.

Aspects and features of embodiments of the present disclosure are not limited to the above-stated aspects and features, and those skilled in the art will clearly understand other not mentioned aspects and features from the below disclosure and accompanying claims.

A pixel in accordance with an embodiment of the present disclosure may include: an emission area, a non-emission area around the emission area, and a split area spaced from the emission area with the non-emission area interposed therebetween; a first pattern and a second pattern spaced from each other in a first direction in the emission area, each of the first pattern and the second pattern extending in a second direction; a first light emitting element aligned between the first pattern and the second pattern; a first electrode electrically connected to a first end of the first light emitting element; a second electrode electrically connected to a second end of the first light emitting element; a bank located in the non-emission area and defining the emission area and the split area; and an insulating pattern located between the first electrode and the second electrode, the insulating pattern overlapping the first light emitting element in a plan view. In the emission area and the non-emission area, the first electrode and the second electrode may come into contact with at least a portion of the insulating pattern, and the first electrode and the second electrode may not overlap the insulating pattern in a plan view.

In an embodiment, the first pattern and the second pattern may extend from the emission area to the non-emission area.

In an embodiment, the insulating pattern may include a first part extending in the second direction between the first pattern and the second pattern, and a second part extending from the first part in the first direction and overlapping one of the first pattern, the second pattern, and the bank.

In an embodiment, in a plan view, only two of the first pattern, the bank, and the insulating pattern may overlap each other.

In an embodiment, in a plan view, the insulating pattern may be spaced from an overlap area where one of the first pattern and the second pattern overlaps the bank.

In an embodiment, in a plan view, a distance by which the insulating pattern is spaced from the overlap area may be greater than a line width of the first electrode.

In an embodiment, in a plan view, a single organic layer may be under each of the first electrode and the second electrode. The single organic layer may include one of the first pattern, the bank, and the insulating pattern.

In an embodiment, in an area where the insulating pattern overlaps one of the first pattern, the second pattern, and the bank, the insulating pattern may be spaced from the first electrode and the second electrode.

In an embodiment, in a plan view, each of the first electrode and the second electrode may extend while bypassing multiple organic layers. The multiple organic layers may include two of the first pattern, the bank, and the insulating pattern.

In an embodiment, at least one of the first electrode and the second electrode may include a third part extending in the second direction, and a fourth part extending from an end area of the third part to the non-emission area in the first direction.

In an embodiment, at least one of the first electrode and the second electrode may include a third part extending in the second direction, and a fourth part extending from a central area of the third part to the non-emission area in the first direction.

In an embodiment, the pixel may further include: a first alignment electrode on the first pattern, and extending in the second direction in the emission area, and extending from the emission area to the split area via the non-emission area; a second alignment electrode on the second pattern, and extending in the second direction in the emission area, and extending from the emission area to the split area via the non-emission area; and a first insulating layer configured to cover overall surfaces of the first and the second alignment electrodes in the emission area, and interposed between the first and the second alignment electrodes and the first and the second electrodes.

In an embodiment, the first alignment electrode may be electrically connected, in the split area, to the first electrode through a first contact hole formed in the first insulating layer. The second alignment electrode may be electrically connected, in the split area, to the second electrode through a second contact hole in the first insulating layer.

In an embodiment, in the emission area, the first alignment electrode and the second alignment electrode may be spaced from each other by a uniform distance, and each of the first alignment electrode and the second alignment electrode may have a uniform width.

In an embodiment, in the emission area, the first pattern may partially overlap the first alignment electrode and has a uniform width, and the second pattern partially may overlap the second alignment electrode, have a uniform width, and be spaced from the first pattern.

In an embodiment, the pixel may further include a second light emitting element aligned between the first pattern and the second pattern.

In an embodiment, the pixel may further include: a third electrode located between the first electrode and the second electrode and electrically connected between the first and the second electrodes through the first and the second light emitting elements; and a third alignment electrode between the first alignment electrode and the second alignment electrode, and overlaps one area of the second pattern.

In an embodiment, the first electrode may overlap a first area of the first alignment electrode and a first end of the first light emitting element. The third electrode may overlap a first area of the third alignment electrode, a second end of the first light emitting element, a second area of the first alignment electrode, and a first end of the second light emitting element, and have a curved shape.

In an embodiment, the third electrode may extend from the emission area to the split area via the non-emission area, and be electrically connected, in the split area, to the third alignment electrode through a third contact hole in the first insulating layer.

In an embodiment, the second pattern may overlap a peripheral area of the bank such that the second pattern is in an area between the third electrode and the second electrode in a boundary between the non-emission area and the split area.

In an embodiment, the pixel may further include: a third pattern facing the first pattern with the second pattern interposed therebetween; and a fourth alignment electrode on the third pattern, and extending in the second direction in the emission area, and extending from the emission area to the split area via the non-emission area.

In an embodiment, the pixel may further include: a fourth electrode having a curved shape to overlap a second area of the third alignment electrode and a first area of the fourth alignment electrode, and electrically connected between the second and the third electrodes; and a fifth electrode having a curved shape to overlap a first area of the second alignment electrode and a second area of the fourth alignment electrode, and electrically connected between the second and the fourth electrodes.

In an embodiment, the pixel may further include: a third light emitting element aligned between the second pattern and the third pattern, and comprising a first end electrically connected to the fourth electrode, and a second end electrically connected to the fifth electrode; and a fourth light emitting element aligned between the second pattern and the third pattern, and comprising a first end electrically connected to the fifth electrode, and a second end electrically connected to the second electrode.

A display device in accordance with an embodiment of the present disclosure may include a pixel provided in a display area. The pixel may include: an emission area, a non-emission area enclosing the emission area, and a split area spaced from the emission area with the non-emission area interposed therebetween; a first pattern and a second pattern spaced from each other in a first direction in the emission area, and each extending in a second direction; a first light emitting element aligned between the first pattern and the second pattern; a first electrode electrically connected to a first end of the first light emitting element; a second electrode electrically connected to a second end of the first light emitting element; a bank located in the non-emission area and defining the emission area and the split area; and an insulating pattern located between the first electrode and the second electrode, and overlapping the first light emitting element in a plan view. In a plan view, only two of the first pattern, the bank, and the insulating pattern may overlap each other.

Details of various embodiments are included in the detailed descriptions and drawings.

BRIEF DESCRIPTION OF THE DRAWINGS

FIG. 2 is a plan view illustrating a display device in accordance with an embodiment of the present disclosure.

FIGS. 5A and 5B are enlarged views of an area AR1 of FIG. 4.

DETAILED DESCRIPTION

Figure 1A:
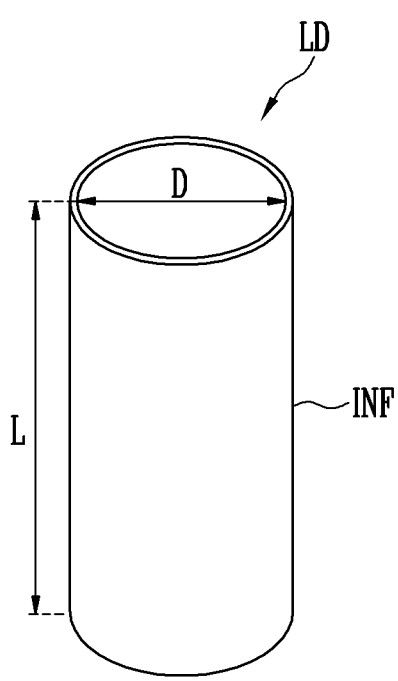
FIG. 1A is a perspective view illustrating a light emitting element in accordance with an embodiment of the present disclosure.

Reference will now be made in detail to various embodiments of the present disclosure, specific examples of which are illustrated in the accompanying drawings and described below, because the embodiments of the present disclosure can be variously modified in many different forms. Furthermore, a singular form may include a plural from as long as it is not specifically mentioned in a sentence.

However, the present disclosure is not limited to the following embodiments and may be modified into various forms. Each embodiment to be described below may be implemented alone, or combined with at least another embodiment to make various combinations of embodiments.

Some elements that are not directly related to the features of the present disclosure in the drawings may be omitted to clearly explain the present disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed herein could be termed a second element, component, region, layer or section, without departing from the scope of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Figure 1B:
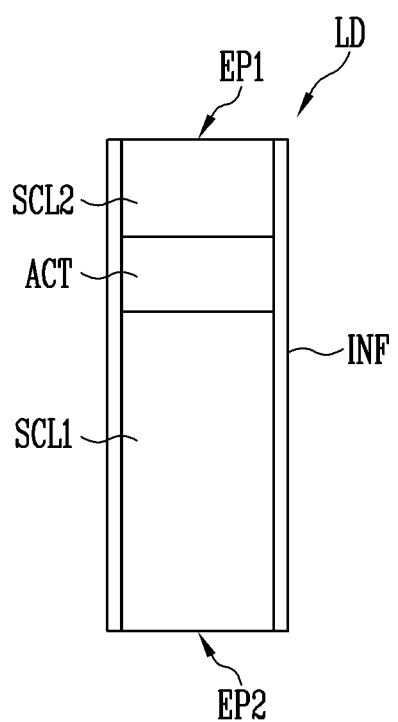
FIGS. 1B-1D are sectional views illustrating the light emitting element of FIG. 1A.
Figure 1C:
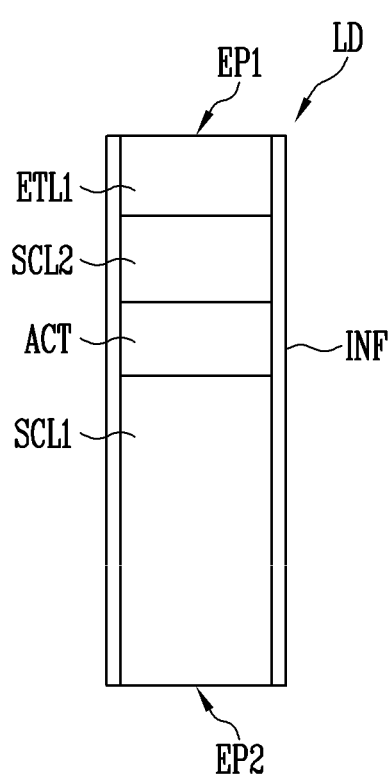
Figure 1D:
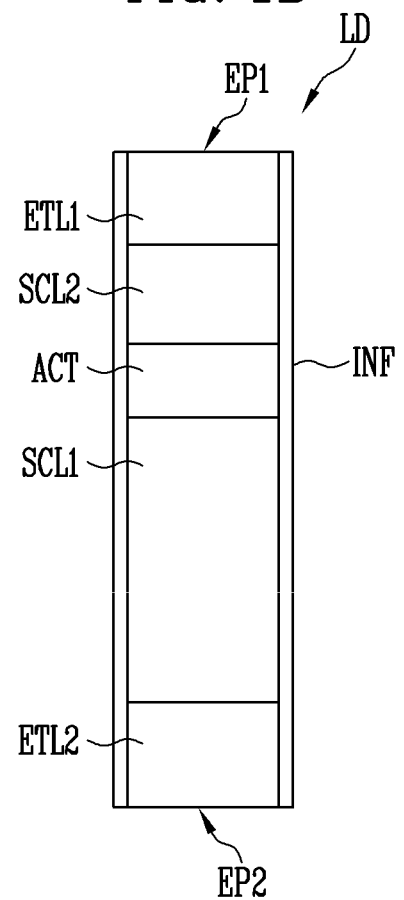

FIG. 1A is a perspective view illustrating a light emitting element LD in accordance with an embodiment of the present disclosure. FIGS. 1B-1D are sectional views illustrating the light emitting element LD of FIG. 1A. For example, FIGS. 1B-1D illustrate different embodiments of the configuration of the light emitting element LD of FIG. 1A. Although FIGS. 1A-1D illustrate cylindrical rod-type light emitting elements LD, the type and/or shape of the light emitting elements LD is not limited thereto.

Referring to FIGS. 1A-1D, the light emitting element LD may include a first semiconductor layer SCL1, a second semiconductor layer SCL2, and an active layer ACT interposed between the first and second semiconductor layers SCL1 and SCL2. For example, the light emitting element LD may include the first conductive semiconductor layer SCL1, the active layer ACT, and the second conductive semiconductor layer SCL2 that are successively stacked in a longitudinal direction (L).

The light emitting element LD may be provided in the form of a rod extending in one direction. If the direction in which the light emitting element LD extends is defined as the longitudinal direction (L), the light emitting element LD may have a first end EP1 and a second end EP2 with respect to the longitudinal direction (L).

One of the first and second semiconductor layers SCL1 and SCL2 may be disposed on the first end EP1 of the light emitting element LD. The other one of the first and second semiconductor layers SCL1 and SCL2 may be disposed on the second end EP2 of the light emitting element LD. For example, the second semiconductor layer SCL2 may be disposed on the first end EP1 of the light emitting element LD, and the first semiconductor layer SCL1 may be disposed on the second end EP2.

In an embodiment, the light emitting element LD may be a rod-type (or bar-type) light emitting element (referred also to as "rod-type light emitting diode" or "bar-type light emitting diode") fabricated in the form of a rod (or a bar) by an etching scheme or the like. In this specification, the term "rod-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size ranging from the nanometer scale to the micrometer scale. For example, each light emitting element LD may have a diameter D (or a width) and/or a length L ranging from the nanometer scale to the micrometer scale. However, in the present disclosure, the size of the light emitting element LD is not limited thereto. For example, the size of the light emitting element LD may be changed depending on design conditions of various devices, e.g., a display device that employs the light emitting element LD as a light source.

The first semiconductor layer SCL1 may be a first conductive semiconductor layer. For example, the first semiconductor layer SCL1 may include an N-type semiconductor layer. For instance, the first semiconductor layer SCL1 may include an N-type semiconductor layer that includes any one semiconductor material of InAlGaN, GaN, AlGaN, InGaN, AlN, and InN and is doped with a first conductive dopant such as Si, Ge, or Sn. Furthermore, the first semiconductor layer SCL1 may be formed of various other materials.

The active layer ACT may be disposed on the first semiconductor layer SCL1 and have a single-quantum well structure or a multi-quantum well structure. The location of the active layer ACT may be changed in various ways depending on the type of the light emitting element LD. The active layer ACT may emit light having a wavelength ranging from 400 nm to 900 nm, and use a double hetero structure.

A cladding layer doped with a conductive dopant may be formed on and/or under the active layer ACT. For example, the cladding layer may be formed of an ALGaN layer or an InALGaN layer. In an embodiment, a material such as AlGaN or AlInGaN may be used to form the active layer ACT, and various other materials may be used to form the active layer ACT.

The second semiconductor layer SCL2 may be disposed on the active layer ACT and include a semiconductor layer having a type different from that of the first semiconductor layer SCL1. For example, the second semiconductor layer SCL2 may include a P-type semiconductor layer. For instance, the second semiconductor layer SCL2 may include a P-type semiconductor layer that includes any one semiconductor material of InAlGaN, GaN, AlGaN, InGaN, AlN, and InN, and is doped with a second conductive dopant such as Mg. Furthermore, the second semiconductor layer SCL2 may be formed of various other materials.

In an embodiment, the first semiconductor layer SCL1 and the second semiconductor layer SCL2 may have different lengths (or thicknesses) with respect to the longitudinal direction (L) of the light emitting element LD. For example, the first semiconductor layer SCL1 may have a length (or a thickness) greater than that of the second semiconductor layer SCL2 with respect to the longitudinal direction (L) of the light emitting element LD. Hence, the active layer ACT of the light emitting element LD may be disposed closer to the first end EP1 than to the second end EP2.

If a voltage equal to or greater than a threshold voltage is applied between the opposite ends (e.g., the first end EP1 and the second end EP2) of the light emitting element LD, the light emitting element LD emits light by coupling of electron-hole pairs in the active layer ACT. Because light emission of the light emitting element LD can be controlled based on the foregoing principle, the light emitting element LD may be used as a light source of various light emitting devices as well as a pixel of the display device.

In an embodiment, the light emitting element LD may further include additional other components as well as the first semiconductor layer SCL1, the active layer ACT, and the second semiconductor layer SCL2. For example, the light emitting element LD may further include at least one fluorescent layer, at least one active layer, at least one semiconductor layer and/or at least one electrode layer disposed on one end of the first semiconductor layer SCL1, the active layer ACT, and/or the second semiconductor layer SCL2.

For example, as illustrated in FIG. 1C, the light emitting element LD may further include an electrode layer ETL1 disposed on one end of the second semiconductor layer SCL2. In this case, the electrode layer ETL1 may be disposed on the first end EP1 of the light emitting element LD.

As illustrated in FIG. 1D, the light emitting element LD may further include another electrode layer ETL2 disposed on one end of the first semiconductor layer SCL1. For example, the electrode layers ETL1 and ETL2 may be disposed on the first and second ends EP1 and EP2 of the light emitting element LD.

The electrode layers ETL1 and ETL2 each may be an ohmic contact electrode, but the present disclosure is not limited thereto. For example, the electrode layers ETL1 and ETL2 each may be a Schottky contact electrode.

The electrode layers ETL1 and ETL2 may include metal or conductive oxide. For example, the electrode layers ETL1 and ETL2 may be formed using chrome (Cr), titanium (Ti), aluminum (Al), gold (Au), nickel (Ni), an oxide or alloy thereof, ITO, etc., alone or in combination with each other. Materials included in the respective electrode layers ETL1 and ETL2 may be equal to or different from each other.

The electrode layers ETL1 and ETL2 may be substantially transparent or semitransparent. Thereby, light generated from the light emitting element LD may be emitted to the outside after passing through the electrode layers ETL1 and ETL2. In an embodiment, in the case where light generated from the light emitting element LD is emitted outside the light emitting element LD through an area other than the opposite ends of the light emitting element LD rather than passing through the electrode layers ETL1 and ETL2, the electrode layers ETL1 and ETL2 may be opaque.

In an embodiment, the light emitting element LD may further include an insulating film INF provided on the surface (e.g., an outer circumferential or peripheral surface) of the light emitting element LD. The insulating film INF may be formed on the surface of the light emitting element LD to enclose an outer surface (e.g., an outer circumferential or peripheral surface) of at least the active layer ACT, and may further enclose one or more areas (e.g., set or predetermined areas) of the first and second semiconductor layers SCL1 and SCL2.

In the case where the light emitting element LD includes the electrode layers ETL1 and ETL2, the insulating film INF may at least partially enclose or not enclose the outer surfaces (e.g., the outer circumferential or peripheral surfaces) of the electrode layers ETL1 and ETL2. In other words, the insulating film INF may be selectively formed on the outer surfaces (e.g., the outer circumferential or peripheral surfaces) of the electrode layers ETL1 and ETL2.

The insulating film INF may expose the opposite ends of the light emitting element LD with respect to the longitudinal direction (L) of the light emitting element LD. For example, the insulating film INF may expose at least one of the first and second semiconductor layers SCL1 and SCL2 and the electrode layers ETL1 and ETL2 on the first and second ends EP1 and EP2 of the light emitting element LD. Alternatively, in an embodiment, the insulating film INF may not be provided in the light emitting element LD.

If the insulating film INF is provided on the outer surface of the light emitting element LD, for example, on the outer circumferential or peripheral surface of the active layer ACT, the active layer ACT may be prevented from short-circuiting with at least one electrode, e.g., an alignment electrode and/or a pixel electrode that will be described below. Consequently, the electrical stability of the light emitting element LD may be secured.

The insulating film INF may include transparent insulating material. For example, the insulating film INF may include at least one insulating material among $SiO_2$ or silicon oxide ($SiO_x$) that is not limited to $SiO_2$, $Si_3N_4$ or silicon nitride ($SiN_x$) that is not limited to $Si_3N_4$, $Al_2O_3$ or aluminum oxide ($Al_xO_y$) that is not limited to $Al_2O_3$, and $TiO_2$ or titanium oxide ($TiO_x$) that is not limited to $TiO_2$, but the present disclosure is not limited thereto. The constituent material of the insulating film INF is not particularly limited.

If the insulating film INF is provided on the surface of the light emitting element LD, occurrence of a defect on the surface of the light emitting element LD may be reduced or minimized, whereby the lifetime and efficiency of the light emitting element LD may be improved. In addition, if the insulating film INF is formed on each light emitting element LD, even when a plurality of light emitting elements LD are disposed adjacent to each other, the light emitting elements LD may be prevented from undesirably short-circuiting.

In an embodiment of the present disclosure, a surface treatment process may be performed to fabricate the light emitting element LD. For example, each light emitting element LD may be surface-treated so that, when a plurality of light emitting elements LD are mixed with a fluidic solution (or solvent) and then supplied to each emission area (e.g., an emission area of each pixel), the light emitting elements LD can be evenly dispersed rather than unevenly aggregating in the solution. In an unlimited embodiment pertaining to this, the insulating film INF itself may be formed of a hydrophobic film using hydrophobic material, or an additional hydrophobic film formed of the hydrophobic material may be formed on the insulating film INF.

The insulating layer INF may be formed of a single layer or multiple layers. For example, the insulating film INF may have a double layer structure.

The insulating film INF may be partially etched in at least one area thereof, e.g., at least one of an upper area and a lower area. In this case, the insulating film INF may have a round shape in the at least one area thereof, but the present disclosure is not limited thereto.

For example, in at least one area of the upper area and the lower area of the insulating layer INF, a portion or the entirety of the insulating film INF may be removed. Hence, at least one of the first semiconductor layer SCL1, the second semiconductor layer SCL2, and the electrodes ETL1 and ETL2 may be partially exposed.

The light emitting element LD described above may be used in various devices including a display device that requires a light source. For instance, a plurality of light emitting elements LD may be disposed in each pixel of a display panel, so that the light emitting elements LD may be used as a light source of the pixel. However, the application field of the light emitting element LD is not limited to the foregoing examples. For example, the light emitting element LD may also be used in other types of devices such as a lighting device that requires a light source.

FIG. 2 is a plan view illustrating a display device DD in accordance with an embodiment of the present disclosure. FIG. 2 discloses the display device DD as an example of an electronic device that can use the light emitting element LD described in the embodiments of FIGS. 1A-1D as a light source, and also discloses the structure of the display device DD centered on a display panel DP. For example, each pixel PXL of the display panel DP may have at least one light emitting element LD.

For the sake of explanation, FIG. 2 illustrates the structure of the display panel DP, centered on a display area DA. In some embodiments, at least one driving circuit, lines, and/or pads may be further provided on the display panel DP.

Referring to FIG. 2, the display panel DP in accordance with an embodiment of the present disclosure may include a base layer BSL, and pixels PXL provided on the base layer BSL.

The display panel DP may have various shapes. For example, the display panel DP may have a rectangular planar shape, but the present disclosure is not limited thereto. For instance, the display panel DP may have a circular or elliptical shape. Furthermore, the display panel DP may have an angled corner and/or curved corner. For the sake of explanation, FIG. 2 illustrates that the display panel DP has a rectangular planar shape. In addition, in FIG. 2, an extension direction (e.g., a horizontal direction) of a short side of the display panel DP is designated as a first direction DR1, and an extension direction (e.g., a vertical direction) of a long side thereof is designated as a second direction DR2.

The display panel DP and the base layer BSL for forming the display panel DP may include a display area DA for displaying an image, and a non-display area NA formed in an area (e.g., a set or predetermined area) other than the display area DA. For example, the non-display area NA may surround the display area DA along the edge or periphery of the display area DA. The display area DA may form a screen on which an image is displayed. The non-display area NA may be an area formed in an area (e.g., a set or predetermined area) other than the display area DA.

The pixels PXL may be disposed in the display area DA on the base layer BSL. For example, the display area DA may include a plurality of pixel areas on which the respective pixels PXL are disposed.

The non-display area NA may be disposed around the display area DA. Various lines, pads, and/or internal circuits that are coupled to the pixels PXL of the display area DA may be disposed in the non-display area NA. In the description of the embodiments of the present disclosure, the term "coupling (or connection)" may comprehensively refer to physical and/or electrical coupling (or connection). Furthermore, the term "coupling (or connection)" may comprehensively refer to direct or indirect coupling (or connection and integral or non-integral coupling (or connection)).

In an embodiment, at least two kinds of pixels PXL that emit different colors of light may be disposed on the display area DA. Each pixel unit formed of different colors of pixels PXL disposed adjacent to each other may express various colors.

In an embodiment, each pixel PXL may be set to a desired color (e.g., a set or predetermined color) of pixel and may include a light emitting element LD configured to emit the desired color (e.g., the set or predetermined color) of light. In an embodiment, at least some pixels PXL may include a light emitting element LD configured to emit a first color of light, and a light conversion layer configured to convert the first color of light to a second color of light may be disposed over the pixels PXL. Hence, the second color of light may be generated by using the at least some pixels PXL.

The pixel PXL may include at least one light source that is driven by a suitable control signal (e.g., a set or predetermined control signal) (e.g., a scan signal and a data signal) and/or a suitable power supply (e.g., a set or predetermined power supply) (e.g., a first power supply and a second power supply). In an embodiment, the light source may include at least one light emitting element LD illustrated in the embodiments of FIGS. 1A-1D, e.g., at least one rod-type light emitting element LD having a small size corresponding to a range from the nanometer scale to the micrometer scale. In addition, different types of light emitting elements may be used as a light source of the pixel PXL. For example, in an embodiment, the light source of each pixel PXL may be formed of a light emitting element having a core-shell structure.

Furthermore, the pixel PXL may have a structure according to one of embodiments to be described below. For example, each pixel PXL may have a structure to which any one embodiment of the embodiments to be described below is applied or a combination of at least two embodiments thereof is applied.

In an embodiment, the pixel PXL may be formed of an active pixel, but the present disclosure is not limited thereto. For example, the pixel PXL may be formed of a pixel for passive or active light emitting display devices that have various structures and/or may be operated in various driving schemes.

Figure 3A:
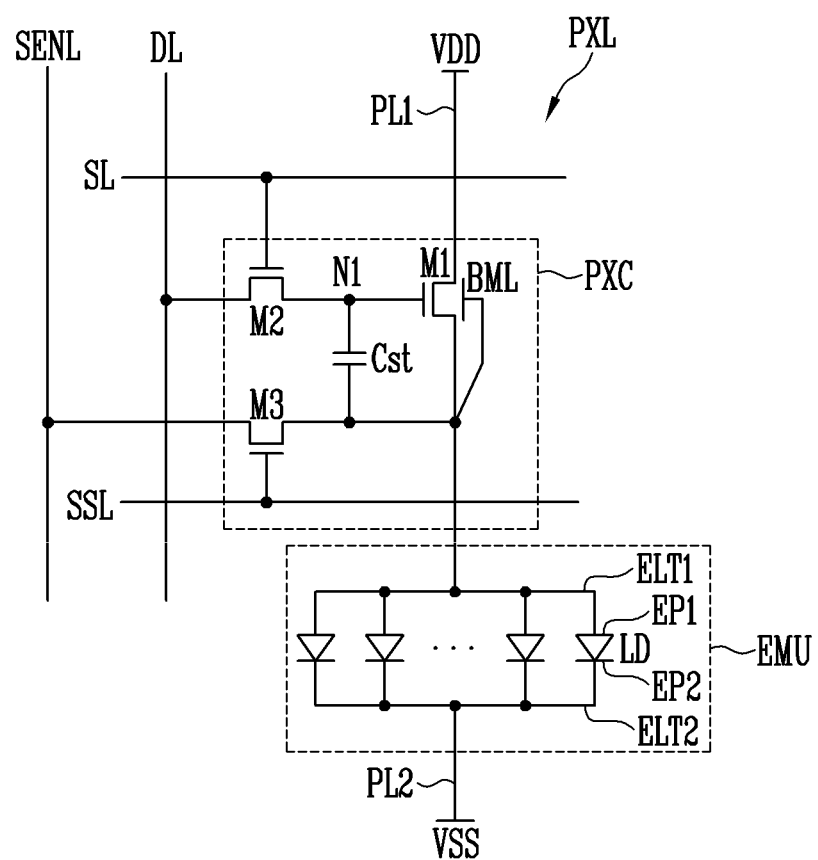
FIGS. 3A-3C are circuit diagrams illustrating a pixel included in the display device of FIG. 2.
Figure 3B:
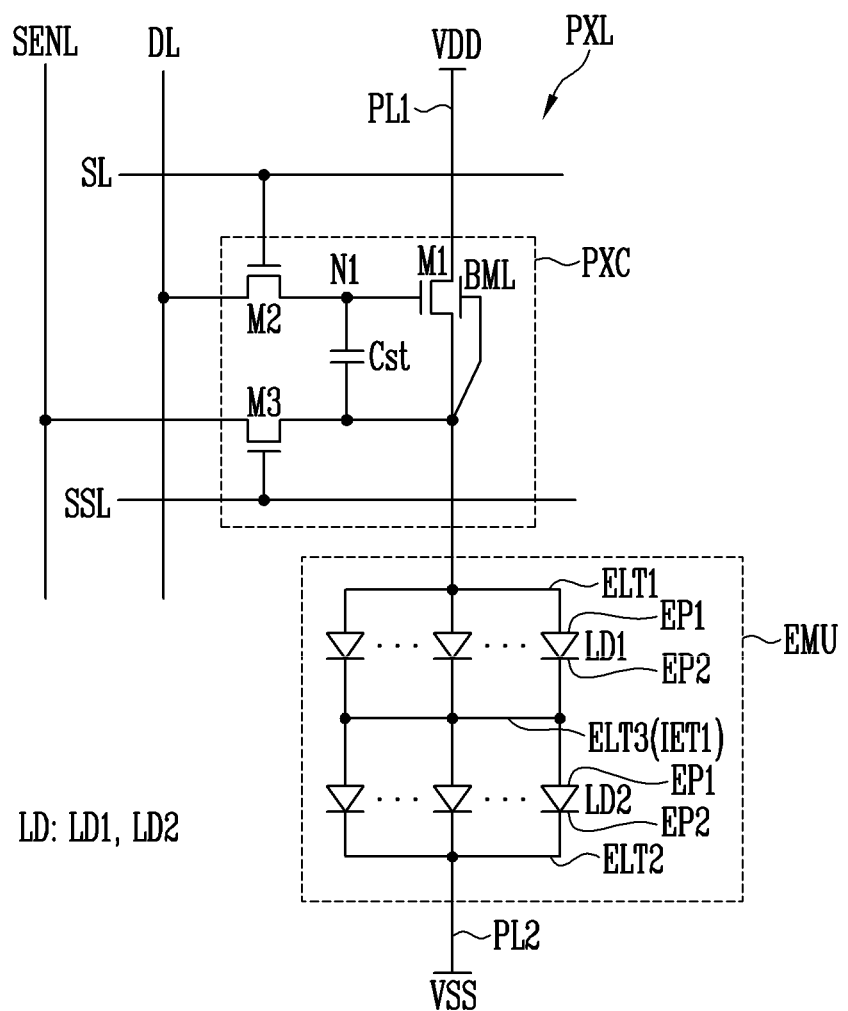
Figure 3C:
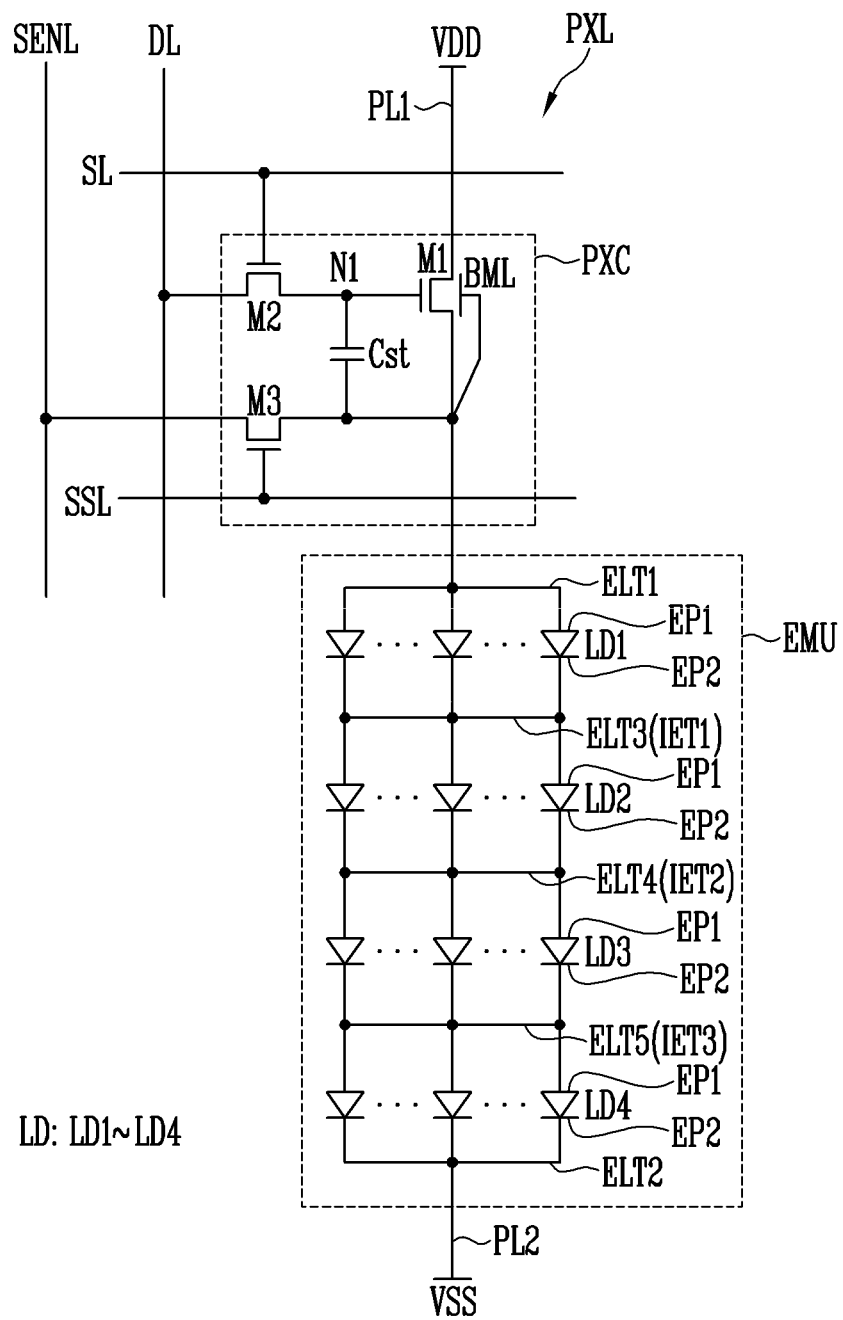

FIGS. 3A-3C are circuit diagrams illustrating a pixel PXL included in the display device DD of FIG. 2. For example, FIGS. 3A-3C illustrate embodiments of the pixel PXL that can be applied to an active display device, and illustrate different embodiments of the structure of an emission circuit EMU.

In an embodiment, each pixel PXL illustrated in FIGS. 3A-3C may be any one of the pixels PXL disposed in the display area DA of FIG. 2. The pixels PXL disposed in the display area DA may have a substantially identical or similar structure.

Referring to FIGS. 3A-3C, the pixel PXL may include an emission circuit EMU configured to generate light having a luminance corresponding to a data signal. Furthermore, the pixel PXL may further include a pixel circuit PXC configured to drive the emission circuit EMU.

The pixel circuit PXC may be coupled between the first power supply VDD and the emission circuit EMU. Furthermore, the pixel circuit PXC may be coupled to a scan line SL and a data line DL of the corresponding pixel PXL, and control the operation of the emission circuit EMU in response to a scan signal and a data signal supplied from the scan line SL and the data line DL. Furthermore, the pixel circuit PXC may be selectively further coupled to a sensing signal line SSL and a sensing line SENL.

The pixel circuit PXC may include at least one transistor and at least one capacitor. For example, the pixel circuit PXC may include a first transistor M1, a second transistor M2, a third transistor M3, and a storage capacitor Cst.

The first transistor M1 is coupled between the first power supply VDD and a first pixel electrode ELT1 of the emission circuit EMU. A gate electrode of the first transistor M1 is coupled to the first node N1. The first transistor M1 may control driving current to be supplied to the emission circuit EMU in response to a voltage of the first node N1. In other words, the first transistor M1 may be a driving transistor configured to control the driving current of the pixel PXL.

In an embodiment, the first transistor M1 may selectively include a bottom metal layer BML (referred also to as "bottom electrode", "back gate electrode" or "bottom light shielding layer"). The gate electrode of the first transistor M1 and the bottom metal layer BML may overlap each other with an insulating layer interposed therebetween. In an embodiment, the bottom metal layer BML may be coupled to one electrode of the first transistor M1, e.g., a source or drain electrode of the first transistor M1.

An embodiment in which the first transistor M1 includes the bottom metal layer BML may employ a back-biasing technique (or a sync technique) of shifting a threshold voltage of the first transistor M1 in a negative direction or a positive direction by applying a bank-biasing voltage to the bottom metal layer BML of the first transistor M1 when the pixel PXL is driven. For example, a source-sync techniques may be used by coupling the bottom metal layer BML to the source electrode of the first transistor M1, so that the threshold voltage of the first transistor M1 may be shifted in the negative direction or the positive direction. In the case where the bottom metal layer BML is disposed under a semiconductor pattern that forms a channel of the first transistor M1, the bottom metal layer BML may function as a light shielding pattern and stabilize operating characteristics of the first transistor M1. Here, the function and/or application scheme of the bottom metal layer BML is not limited thereto.

The second transistor M2 may be coupled between the data line DL and the first node N1. A gate electrode of the second transistor M2 may be coupled to the scan line SL. When a scan signal of a gate-on voltage (e.g., a high-level voltage) is supplied from the scan line SL, the second transistor M2 is turned on to couple the data line DL with the first node N1.

During each frame period, a data signal of a corresponding frame is supplied to the data line DL, and the data signal is transmitted to the first node N1 through the second transistor M2 that is turned on during a period in which the scan signal having the gate-on voltage is supplied to the scan line SL. In other words, the second transistor M2 may be a switching transistor configured to transmit each data signal to the interior of the pixel PXL.

One electrode of the storage capacitor Cst is coupled to the first node N1, and the other electrode thereof is coupled to a second electrode of the first transistor M1. The storage capacitor Cst may charge a voltage (e.g., hold a charge) corresponding to a data signal to be supplied to the first node N1 during each frame period.

The third transistor M3 may be coupled between the first pixel electrode ELT1 of the emission circuit EMU (or the second electrode of the first transistor M1) and the sensing line SENL. A gate electrode of the third transistor M3 may be coupled to the sensing signal line SSL. The third transistor M3 may transmit a voltage value applied to the first pixel electrode ELT1, to the sensing line SENL in response to a sensing signal supplied to the sensing signal line SSL. The voltage value transmitted through the sensing line SENL may be provided to an external circuit (e.g., a timing controller). The external circuit may extract information about characteristics of each pixel PXL (e.g., a threshold voltage of the first transistor M1, etc.) based on the provided voltage value. The extracted characteristic information may be used to convert image data to compensate for a deviation in characteristics between the pixels PXL.

Although FIGS. 3A-3C illustrate that all of the transistors included in the pixel circuit PXC are N-type transistors, the present disclosure is not limited thereto. For example, at least one of the first, second, and third transistors M1, M2, and M3 may be changed to a P-type transistor.

The structure and driving method of the pixel PXL may be changed in various ways. For instance, the pixel circuit PXC may not only be formed of the pixel circuit of the embodiment illustrated in FIGS. 3A-3C but may also be formed of a pixel circuit that may have various structures and/or be operated in various driving manners.

For example, the pixel circuit PXC may not include the third transistor M3. Furthermore, the pixel circuit PXC may further include other additional circuit elements such as a compensation transistor configured to compensate for the threshold voltage of the first transistor M1, an initialization transistor configured to initialize the voltage of the first node N1 and/or the first pixel electrode ELT1 of the emission circuit EMU, an emission control transistor configured to control a period in which driving current is supplied to the emission circuit EMU, and/or a boosting capacitor configured to boost the voltage of the first node N1.

In an embodiment, in the case where the pixel PXL is a pixel of a passive light emitting display device, the pixel circuit PXC may be omitted. In this case, the emission circuit EMU may be directly coupled to the scan line SL, the data line DL, a first power line PL1, a second power line PL2, and/or other signal lines or power lines, etc.

The emission circuit EMU may include at least one light emitting element LD, e.g., a plurality of light emitting elements LD, coupled between the first power supply VDD and the second power supply VSS.

For example, the emission circuit EMU may include a first pixel electrode ELT1 (referred also to as "first electrode" or "first contact electrode") coupled to the first power supply VDD through the pixel circuit PXC and the first power line PL1, a second pixel electrode ELT2 (referred also to as "second electrode" or "second contact electrode") coupled to the second power supply VSS through the second power line PL2, and a plurality of light emitting elements LD coupled between the first and second pixel electrodes ELT1 and ELT2.

The first power supply VDD and the second power supply VSS may have different potentials to allow the light emitting elements LD to emit light. For example, the first power supply VDD may be set as a high-potential power supply, and the second power supply VSS may be set as a low-potential power supply.

In an embodiment, the emission circuit EMU may include a plurality of light emitting elements LD coupled in parallel to each other in the same direction between the first pixel electrode ELT1 and the second pixel electrode ELT2, as illustrated in the embodiment of FIG. 3A. For example, each of the light emitting elements LD may include a first end EP1 (e.g., a P-type end) coupled to the first power supply VDD through the first pixel electrode ELT1 and/or the pixel circuit PXC and the first power line PL1, and a second end EP2 (e.g., an N-type end) coupled to the second power supply VSS through the second pixel electrode ELT2. In other words, the light emitting elements LD may be coupled in parallel between the first and second pixel electrodes ELT1 and ELT2 in a forward direction.

Each light emitting element LD coupled in the forward direction between the first power supply VDD and the second power supply VSS may form a valid light source. Such valid light sources may be collected to form the emission circuit EMU of the corresponding pixel PXL.

The first ends EP1 of the light emitting elements LD may be coupled in common to the pixel circuit PXC through one electrode (e.g., the first pixel electrode ELT1) of the emission circuit EMU, and be coupled to the first power supply VDD through the pixel circuit PXC and the first power line PL1. The second ends EP2 of the light emitting elements LD may be coupled in common to the second power supply VSS through another electrode (e.g., the second pixel electrode ELT2) of the emission circuit EMU and the second power line PL2.

Although FIG. 3A illustrates an embodiment in which the pixel PXL includes the emission circuit EMU having a parallel structure, the present disclosure is not limited thereto. For example, the pixel PXL may include an emission circuit EMU having a serial structure or a serial and/or parallel structure. For example, the emission circuit EMU may include a plurality of light emitting elements LD divided into and coupled to a plurality of serial stages, as illustrated in the embodiments of FIGS. 3B and 3C.

Referring to FIG. 3B, the emission circuit EMU may include a first serial stage including at least one first light emitting element LD1, and a second serial stage including at least one second light emitting element LD2.

The first serial stage may include a first pixel electrode ELT1, a third pixel electrode ELT3 (referred also to as "third electrode" or "third contact electrode"), and at least one first light emitting element LD1 coupled between the first and third pixel electrodes ELT1 and ELT3. Each first light emitting element LD1 may be coupled in the forward direction between the first and third pixel electrodes ELT1 and ELT3. For example, the first end EP1 of the first light emitting element LD1 may be coupled to the first pixel electrode ELT1. The second end EP2 of the first light emitting element LD1 may be coupled to the third pixel electrode ELT3. The third pixel electrode ELT3 may form a first intermediate electrode IET1 that couples the first serial stage with the second serial stage.

The second serial stage may include the third pixel electrode ELT3, the second pixel electrode ELT2, and at least one second light emitting element LD2 coupled between the second and third pixel electrodes ELT2 and ELT3. Each second light emitting element LD2 may be coupled in the forward direction between the second and third pixel electrodes ELT2 and ELT3. For example, the first end EP1 of the second light emitting element LD2 may be coupled to the third pixel electrode ELT3. The second end EP2 of the second light emitting element LD2 may be coupled to the second pixel electrode ELT2.

The number of serial stages that form each emission circuit EMU may be changed in various ways depending on embodiments. For example, the emission circuit EMU may include a plurality of light emitting elements LD divided into and coupled to four serial stages, as illustrated in the embodiment of FIG. 3C.

Referring to FIG. 3C, the emission circuit EMU may include a first serial stage including at least one first light emitting element LD1, a second serial stage including at least one second light emitting element LD2, a third serial stage including at least one third light emitting element LD3, and a fourth serial stage including at least one fourth light emitting element LD4.

The first serial stage may include a first pixel electrode ELT1, a third pixel electrode ELT3, and at least one first light emitting element LD1 coupled between the first and third pixel electrodes ELT1 and ELT3. Each first light emitting element LD1 may be coupled in the forward direction between the first and third pixel electrodes ELT1 and ELT3. For example, the first end EP1 of the first light emitting element LD1 may be coupled to the first pixel electrode ELT1. The second end EP2 of the first light emitting element LD1 may be coupled to the third pixel electrode ELT3.

The second serial stage may include the third pixel electrode ELT3, a fourth pixel electrode ELT4 (referred also to as "fourth electrode" or "fourth contact electrode"), and at least one second light emitting element LD2 coupled between the third and fourth pixel electrodes ELT3 and ELT4. Each second light emitting element LD2 may be coupled in the forward direction between the third and fourth pixel electrodes ELT3 and ELT4. For example, the first end EP1 of the second light emitting element LD2 may be coupled to the third pixel electrode ELT3. The second end EP2 of the second light emitting element LD2 may be coupled to the fourth pixel electrode ELT4.

The third serial stage may include the fourth pixel electrode ELT4, a fifth pixel electrode ELT5 (referred also to as "fifth electrode" or "fifth contact electrode"), and at least one third light emitting element LD3 coupled between the fourth and fifth pixel electrodes ELT4 and ELT5. Each third light emitting element LD3 may be coupled in the forward direction between the fourth and fifth pixel electrodes ELT4 and ELT5. For example, the first end EP1 of the third light emitting element LD3 may be coupled to the fourth pixel electrode ELT4. The second end EP2 of the third light emitting element LD3 may be coupled to the fifth pixel electrode ELT5.

The fourth serial stage may include the fifth pixel electrode ELT5, the second pixel electrode ELT2, and at least one fourth light emitting element LD4 coupled between the second and fifth pixel electrodes ELT2 and ELT5. Each fourth light emitting element LD4 may be coupled in the forward direction between the second and fifth pixel electrodes ELT2 and ELT5. For example, the first end EP1 of the fourth light emitting element LD4 may be coupled to the fifth pixel electrode ELT5. The second end EP2 of the fourth light emitting element LD4 may be coupled to the second pixel electrode ELT2.

In other words, in the embodiments of FIGS. 3A-3C, the emission circuit EMU may include at least one serial stage. Each serial stage may include a pair of pixel electrodes (e.g., two pixel electrodes), and at least one light emitting element LD coupled in the forward direction between the pair of pixel electrodes. Here, the number of serial stages that form the emission circuit EMU and the number of light emitting elements LD that form each serial stage are not particularly limited. For example, the numbers of light emitting elements LD that form the respective serial stages may be identical with or different from each other. The number of light emitting elements LD of each serial stage is not particularly limited.

The 1st electrode of the emission circuit EMU, e.g., the first pixel electrode ELT1, may be an anode electrode of the emission circuit EMU. The last electrode of the emission circuit EMU, e.g., the second pixel electrode ELT2, may be a cathode electrode of the emission circuit EMU.

The other electrodes of the emission circuit EMU, e.g., the third pixel electrode ELT3, the fourth pixel electrode ELT4, and/or the fifth pixel electrode ELT5 of FIGS. 3B and 3C, each may form an intermediate electrode. For example, the third pixel electrode ELT3 may form a first intermediate electrode IET1. The fourth pixel electrode ELT4 may form a second intermediate electrode IET2. The fifth pixel electrode ELT5 may form a third intermediate electrode IET3.

In the case where the light emitting elements LD are coupled only in parallel with each other, as illustrated in the embodiment of FIG. 3A, the structure of the pixel PXL may be simplified. In the case where the light emitting elements LD are coupled in series or in a serial/parallel structure, as illustrated in the embodiments of FIGS. 3B and 3C, the power efficiency may be enhanced, compared to that of the embodiment (e.g., the embodiment of FIG. 3A) in which an equal number of light emitting elements LD are coupled only in parallel to each other. Furthermore, in the pixel PXL in which the light emitting elements LD are coupled in series or in a serial and/or parallel combination structure, even if a short-circuit defect or the like occurs in some serial stages, a certain degree of luminance can be expressed by the light emitting elements LD of the other serial stages, so that the probability of occurrence of a black spot defect in the pixel PXL can be reduced.

Although FIGS. 3A-3C illustrate the embodiments in which the light emitting elements LD are coupled in parallel or in a serial and/or parallel structure, the present disclosure is not limited thereto. For example, in an embodiment, the emission circuit EMU may be formed by coupling the light emitting elements LD only in series.

Each of the light emitting elements LD may include a first end EP1 (e.g., a P-type end) coupled to the first power supply VDD via at least one pixel electrode (e.g., the first pixel electrode ELT1), the pixel circuit PXC, and/or the first power line PL1, etc., and a second end EP2 (e.g., an N-type end) coupled to the second power supply VSS via at least another pixel electrode (e.g., the second pixel electrode ELT2), and the second power line PL2, etc. In other words, the light emitting elements LD may be coupled in the forward direction between the first power supply VDD and the second power supply VSS. The light emitting elements LD coupled in the forward direction may form valid light sources of the emission circuit EMU.

The light emitting elements LD may emit, when driving current is supplied thereto through the corresponding pixel circuit PXC, light having a luminance corresponding to the driving current. For example, during each frame period, the pixel circuit PXC may supply driving current corresponding to a gray scale value to be expressed in a corresponding frame to the emission circuit EMU. Hence, the light emitting elements LD may emit light at a luminance corresponding to the driving current, so that the emission circuit EMU may express the luminance corresponding to the driving current.

In an embodiment, the emission circuit EMU may further include at least one invalid light source, as well as including the light emitting elements LD that form the respective valid light sources. For example, in at least one serial stage, at least one invalid light emitting element that is oriented in a reverse direction, or which has at least one end that floats, may be further provided. The invalid light emitting element may remain disabled even when a driving voltage is applied in a forward direction between the corresponding pixel electrodes, and thus remain substantially non-emitted.

Figure 4:
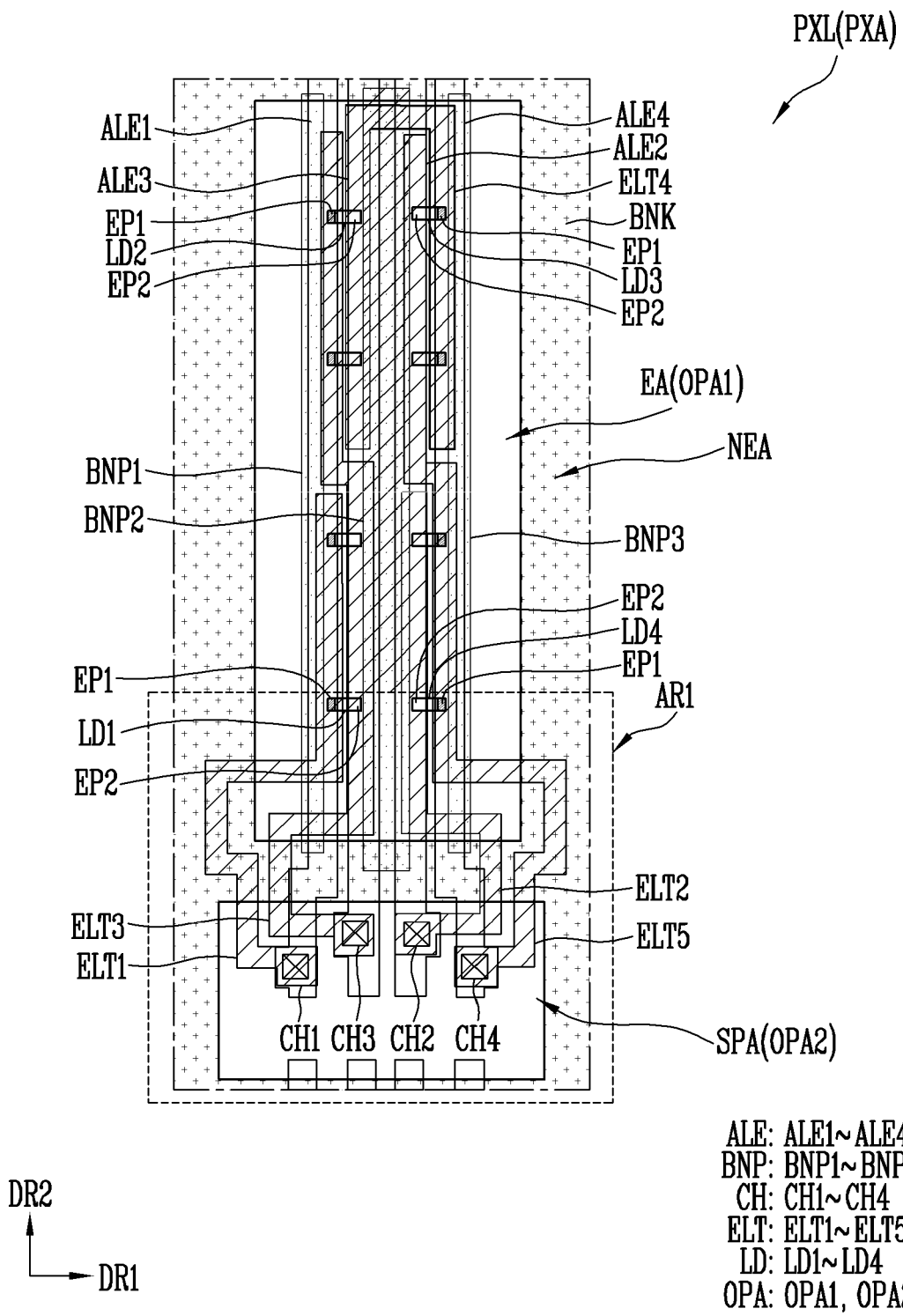
FIG. 4 is a plan view illustrating a pixel included in the display device of FIG. 2 in accordance with an embodiment.
Figure 5A:
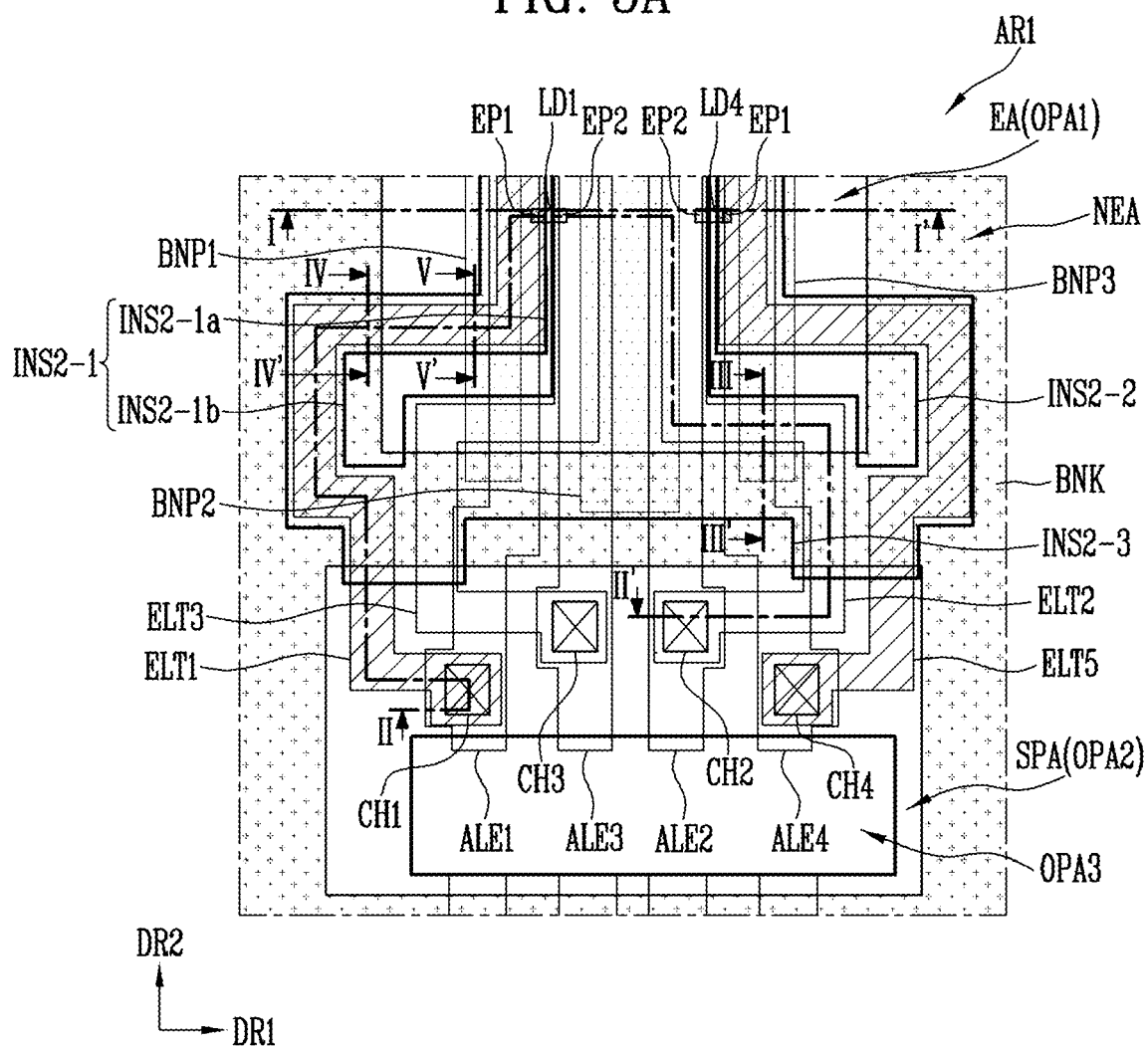

FIG. 4 is a plan view illustrating a pixel PXL included in the display device of FIG. 2 in accordance with an embodiment. For example, centered on an emission circuit EMU of a pixel PXL including four serial stages in the same manner as that of the embodiment of FIG. 3C, FIG. 4 illustrates an embodiment of a pixel area PXA of the pixel PXL. FIGS. 5A and 5B are enlarged views of an area AR1 of FIG. 4. FIG. 5A illustrates that a second insulating layer INS2 is further disposed in the pixel PXL. For the sake of explanation of relationship between patterns BNP, a bank BNK, and the second insulating layer INS2 included in FIG. 4, FIG. 5B schematically illustrates the pixel PXL, centered on the patterns BNP, the bank BNK, and the second insulating layer INS2.

Referring to FIGS. 2, 3C, 4, 5A, and 5B, the pixel PXL may include an emission area EA, a non-emission area NEA, and a split area SPA. For example, the pixel area PXA in which each pixel PXL is provided may include an emission area EA in which light emitting elements LD are provided and/or aligned, a non-emission area NEA that encloses the emission area EA, and a split area SPA spaced from the emission area EA with the non-emission area NEA interposed therebetween.

The emission area EA may be an area that includes the light emitting elements LD and thus is able to emit light. The non-emission area NEA may be an area where the bank BNK enclosing the emission area EA is provided. The split area SPA may be an area that is disposed in a second opening OPA2 of the bank BNK in the other portion of the pixel area PXA except the emission area EA, and in which at least one alignment electrode ALE is cut off.

The pixel PXL may include pixel electrodes ELT provided in at least the emission area EA, light emitting elements LD electrically connected between the pixel electrodes ELT, alignment electrodes ALE provided at positions corresponding to the pixel electrodes ELT, and patterns BNP provided under the alignment electrodes ALE such that each overlaps at least one alignment electrode ALE. For example, the pixel PXL may include first to fifth pixel electrodes ELT1 to ELT5 provided in at least the emission area EA, first to fourth light emitting elements LD1 to LD4 electrically connected between the first to fifth pixel electrodes ELT1 to ELT5, first to fourth alignment electrodes ALE1 to ALE4 provided under the first to fifth pixel electrodes ELT1 to ELT5 such that each overlaps at least one pixel electrode ELT, and first to third patterns BNP1 to BNP3 provided under the first to fourth alignment electrodes ALE1 to ALE4 such that each partially overlaps at least one alignment electrode ALE. Each pixel PXL may include at least a pair of pixel electrodes ELT, alignment electrodes ALE and/or patterns BNP. The numbers, shapes, sizes, arrangement structures, etc. of the pixel electrodes ELT, the alignment electrodes ALE, and/or patterns BNP may be changed in various ways depending on the structure of the pixel PXL (for example, the emission circuit EMU described with reference to FIGS. 3A-3C).

In an embodiment, based on one surface of the base layer BSL in which the pixel PXL is formed, the patterns BNP, the alignment electrodes ALE, the light emitting elements LD, and the pixel electrodes ELT may be successively provided in the order listed. In an embodiment, based on one surface of the base layer (refer to "BSL" of FIG. 2) in which the pixel PXL is formed, the alignment electrodes ALE, the patterns BNP, the light emitting elements LD, and the pixel electrodes ELT may be successively provided in the order listed. In addition, the positions and formation sequence of the electrode patterns and/or insulating patterns that form the pixel PXL may be changed in various ways depending on embodiments. The cross-sectional structure of the pixel PXL will be described in detail below.

The patterns BNP may be provided in at least the emission area EA, and may be spaced from each other with respect to the first direction DR1 in the emission area EA, and each may extend in the second direction DR2. In an embodiment, the first direction DR1 may be a horizontal direction or a row direction, and the second direction DR2 may be a vertical direction or a column direction, but the present disclosure is not limited thereto.

Each pattern BNP (referred also to as "wall pattern" or "protrusion pattern") may have an uniform width in the emission area EA. For example, each of the first, second, and third patterns BNP1, BNP2, and BNP3 may have a linear pattern shape having a constant width in the emission area EA, in a plan view.

The patterns BNP may have an identical width or different widths. For example, the first and third patterns BNP1 and BNP3 may have an identical width in the first direction DR1 in at least the emission area EA, and face each other with the second pattern BNP2 interposed therebetween. For example, the first and third patterns BNP1 and BNP3 may be symmetrical with each other based on the second pattern BNP2.

The patterns BNP may be arranged at regular intervals in the emission area EA. For example, the first, second, and third patterns BNP1, BNP2, and BNP3 may be successively arranged in the emission area EA at regular intervals corresponding to a first distance along the first direction DR1.

Each pattern BNP may partially overlap at least one alignment electrode ALE in at least the emission area EA. For example, the first pattern BNP1 may be provided under the first alignment electrode ALE1 and overlap an area (e.g., a set or predetermined area) of the first alignment electrode ALE1. The second pattern BNP2 may be provided under the second and third alignment electrodes ALE2 and ALE3 and overlap respective areas (e.g., respective set or predetermined areas) of the second and third alignment electrodes ALE2 and ALE3. The third pattern BNP3 may be provided under the fourth alignment electrode ALE4 and overlap an area (e.g., a set or predetermined area) of the fourth alignment electrode ALE4.

Because the patterns BNP are provided under respective areas (e.g., respective set or predetermined areas) of the alignment electrodes ALE, the respective areas (e.g., respective set or predetermined areas) of the alignment electrodes ALE may protrude upward in the areas where the respective patterns BNP are formed. Consequently, a wall structure may be formed around the light emitting elements LD. For example, the wall structure may be formed in the emission area EA and face the first and second ends EP1 and EP2 of the light emitting elements LD.

In an embodiment, in the case where the patterns BNP and/or the alignment electrodes ALE include reflective material, a reflective wall structure may be formed around the light emitting elements LD. Hence, light emitted from the light emitting elements LD may be more effectively oriented in an upward direction of the pixel PXL (e.g., in a frontal direction of the display panel DP including a suitable viewing angle range (e.g., a set or predetermined viewing angle range)), so that the light efficiency of the pixel PXL may be improved.

In an embodiment, at least one pattern BNP may extend from the emission area EA to the non-emission area NEA. In a boundary between the non-emission area NEA and the split area SPA, the at least one pattern BNP may overlap a perimeter area of the bank BNK (e.g., a lower perimeter area of the bank BNK based on the emission area EA) such that one area of the at least one pattern BNP is disposed in an area between a pair of pixel electrodes ELT. Likewise, in a boundary of the non-emission area NEA and the split area SPA (e.g., a split area of another pixel PXL), the at least one pattern BNP may overlap a perimeter area of the bank BNK (e.g., an upper perimeter area of the bank BNK based on the emission area EA) such that one area of the at least one pattern BNP is disposed between the pair of pixel electrodes ELT. Here, the pair of pixel electrodes ELT may be pixel electrodes ELT formed on an identical layer during an identical process, and/or pixel electrodes ELT adjacent to each other.

For example, the second pattern BNP2 may extend from the emission area EA to the non-emission area NEA. Furthermore, in a plan view, one area of the second pattern BNP2 may be disposed in an area between the first and second pixel electrodes ELT1 and ELT2, between the fourth and fifth pixel electrodes ELT4 and ELT5, and/or between the second and third pixel electrodes ELT2 and ELT3, and overlap the perimeter area of the bank BNK. For example, the second pattern BNP2 may have a top and bottom symmetrical shape based on the emission area EA. However, the present disclosure is not limited thereto. For example, in an embodiment, the second pattern BNP2 may extend to the split area SPA.

In a manner similar to the second pattern BNP2, the first pattern BNP1 and the third pattern BNP3 may extend from the emission area EA to the non-emission area NEA.

In this case, during a process of fabricating the pixel PXL, an electric field (and an electric-osmosis or alternating current electric-osmosis (ACEO) phenomenon resulting from the electric field) may be uniformly formed in the emission area EA between the first, second, third, and fourth alignment electrodes ALE1, ALE2, ALE3, and ALE4 disposed on the first to third patterns BNP1, BNP2, and BNP3. For example, the electric field may also be uniformly formed in the perimeter of the emission area EA adjacent to the non-emission area NEA, and the light emitting elements LD may be more uniformly aligned between the first, second, third, and fourth alignment electrodes ALE1, ALE2, ALE3, and ALE4.

The alignment electrodes ALE may be provided in at least the emission area EA, and may be spaced from each other with respect to the first direction DR1 in the emission area EA, and each may extend in the second direction DR2. Furthermore, the alignment electrodes ALE may extend from the emission area EA to the split area SPA via the non-emission NEA, and be cut off in the split area SPA. For example, each of the first to fourth alignment electrodes ALE1 to ALE4 may extend from the emission area EA to the split area SPA, and may be cut of in the split area SPA and thus separated from the alignment electrodes ALE of an adjacent pixel PXL in the second direction DR2. In an embodiment, at least one of the alignment electrodes ALE, e.g., the second alignment electrode ALE2, may be integrally coupled to the second alignment electrode ALE2 of an adjacent pixel PXL without being cut off in the split area SPA.

Figure 8A:
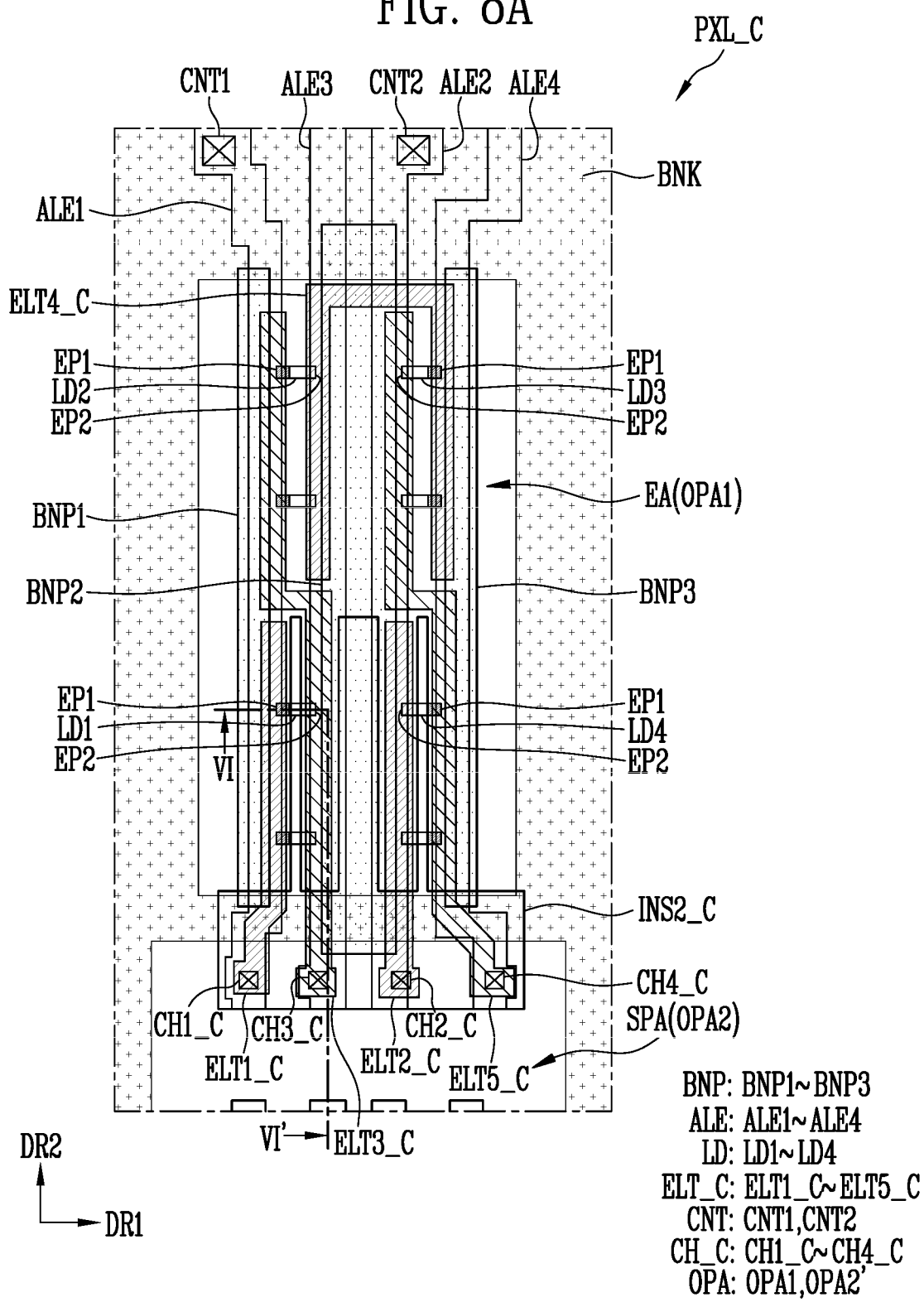
FIG. 8A is a plan view illustrating a pixel in accordance with a comparative embodiment.

Any one of the alignment electrodes ALE and another alignment electrode ALE may be coupled to the pixel circuit PXC and/or a power line (e.g., a predetermined power line) through respective contactors (refer to "CNT" of FIG. 8A). For example, the first alignment electrode ALE1 may be coupled to the pixel circuit PXC and/or the first power line (refer to "PL1" of FIG. 3C) through a first contactor (refer to "CNT1" of FIG. 8A). The second alignment electrode ALE2 may be coupled to the second power line (refer to "PL2" of FIG. 3C) through a second contactor (refer to "CNT2" of FIG. 8A). The contactor CNT may be formed in the split area SPA or the non-emission area NEA.

In an embodiment, each alignment electrode ALE may be coupled to any one pixel electrode ELT through a corresponding contact hole CH. The alignment electrodes ALE may be coupled to different pixel electrodes ELT. For example, the first alignment electrode ALE1 may be electrically connected to the first pixel electrode ELT1 through a first contact hole CH1. The second alignment electrode ALE2 may be electrically connected to the second pixel electrode ELT2 through a second contact hole CH2. The third alignment electrode ALE3 may be electrically connected to the third pixel electrode ELT3 through a third contact hole CH3. The fourth alignment electrode ALE4 may be electrically connected to the fifth pixel electrode ELT5 through a fourth contact hole CH4.

In an embodiment, the contact holes CH for the alignment electrodes ALE to the respective pixel electrodes ELT may be formed in the split area SPA. For example, the contact holes CH may be formed in at least one insulating layer (e.g., a first insulating layer INS1 of FIG. 6B and a second insulating layer INS2 of FIG. 5A and FIG. 6B) that covers the alignment electrodes ALE. The contact holes CH may be formed in the split area SPA rather than being formed in the emission area EA. In this case, the alignment electrodes ALE may be completely covered with the insulating layer in the emission area EA, and may be exposed through the contact holes CH formed in the insulating layer in the split area SPA so that the alignment electrodes ALE can be coupled to the respective pixel electrodes ELT through the contact holes CH.

Each alignment electrode ALE may be disposed on any one pattern BNP. For example, the first alignment electrode ALE1 may be disposed on one area of the first pattern BNP1. The second and third alignment electrodes ALE2 and ALE3 may be disposed on different areas of the second pattern BNP2. The fourth alignment electrode ALE4 may be disposed on one area of the third pattern BNP3. In an embodiment, in the case where the third alignment electrode ALE3 is disposed between the first and second alignment electrodes ALE1 and ALE2, the third alignment electrode ALE3 may be disposed on a left side area of the second pattern BNP2, and the second alignment electrode ALE2 may be disposed on a right side area of the second pattern BNP2.

Each alignment electrode ALE may have a uniform width in the emission area EA. For example, each of the first, second, third, and fourth alignment electrodes ALE1, ALE2, ALE3, and ALE4 may have a linear pattern shape having a constant width in the emission area EA, in a plan view. The alignment electrodes ALE may have an identical width or different widths.

Furthermore, each alignment electrode ALE may extend in the second direction DR2 in the emission area EA. For example, each alignment electrode ALE may extend in the second direction DR2 in the emission area EA.

A pair of alignment electrodes ALE adjacent to each other may be supplied with different signals at the step of aligning the light emitting elements LD and may be spaced from each other by a uniform or substantially uniform distance in the emission area EA. Furthermore, when at least two pairs of alignment electrodes ALE are provided in the emission area EA, each pair of alignment elements ALE may be spaced from each other by an identical distance or by a substantially identical distance.

For example, it will be assumed that the first alignment electrode ALE1, the third alignment electrode ALE3, the second alignment electrode ALE2, and the fourth alignment electrode ALE4 are successively arranged along the first direction DR1 in the emission area EA, the first and third alignment electrodes ALE1 and ALE3 make a pair and are supplied with different alignment signals, and the second and fourth alignment electrodes ALE2 and ALE4 make a pair and are supplied with different alignment signals. In this case, in the emission area EA, the first and third alignment electrodes ALE1 and ALE3 may be spaced from each other by a suitable distance (e.g., a set or predetermined distance) corresponding to a second distance in the first direction DR1, and the second and fourth alignment electrodes ALE2 and ALE4 may also be spaced from each other by a suitable distance (e.g., a set or predetermined distance) corresponding to the second distance in the first direction DR1.

In an embodiment, the second and third alignment electrodes ALE2 and
ALE3 may be supplied with an identical signal at the step of aligning the light emitting elements LD during a process of fabricating the pixel PXL. In this case, the second and third alignment electrodes ALE2 and ALE3 may be spaced from each other by a distance that is the same or different from the second distance. Furthermore, the second and third alignment electrodes ALE2 and ALE3 may be integrally or non-integrally coupled to each other at the step of aligning the light emitting elements LD.

Each alignment electrode ALE may have or may not have a curved portion in the non-emission area NEA and/or the split area SPA. The shape and/or size of the alignment electrode ALE in remaining areas other than the emission area EA is not particularly limited. For example, in the non-emission area NEA and/or the split area SPA, the shapes and/or sizes of the alignment electrodes ALE may be changed in various ways.

The light emitting elements LD each may be aligned between a pair of patterns BNP, and each may be coupled between a pair of pixel electrodes ELT.

For example, each first light emitting element LD1 may be aligned between the first and second patterns BNP1 and BNP2 and electrically connected between the first and third pixel electrodes ELT1 and ELT3. Each second light emitting element LD2 may be aligned between the first and second patterns BNP1 and BNP2 and electrically connected between the third and fourth pixel electrodes ELT3 and ELT4. For example, each first light emitting element LD1 may be aligned in a lower area in an area between the first and second patterns BNP1 and BNP2. The first end EP1 and the second end EP2 of the first light emitting element LD1 may be respectively coupled to the first pixel electrode ELT1 and the third pixel electrode ELT3. For example, each second light emitting element LD2 may be aligned in an upper area in the area between the first and second patterns BNP1 and BNP2. The first end EP1 and the second end EP2 of the second light emitting element LD2 may be respectively coupled to the third pixel electrode ELT3 and the fourth pixel electrode ELT4.

Likewise, each third light emitting element LD3 may be aligned between the second and third patterns BNP2 and BNP3 and electrically connected between the fourth and fifth pixel electrodes ELT4 and ELT5. Each fourth light emitting element LD4 may be aligned between the second and third patterns BNP2 and BNP3 and electrically connected between the second and fifth pixel electrodes ELT2 and ELT5. For example, each third light emitting element LD3 may be aligned in an upper area in an area between the second and third patterns BNP2 and BNP3. The first end EP1 and the second end EP2 of the third light emitting element LD3 may be respectively coupled to the fourth pixel electrode ELT4 and the fifth pixel electrode ELT5. Each fourth light emitting element LD4 may be aligned in a lower area in the area between the second and third patterns BNP2 and BNP3. The first end EP1 and the second end EP2 of the fourth light emitting element LD4 may be respectively coupled to the fifth pixel electrode ELT5 and the second pixel electrode ELT2.

For example, a plurality of first light emitting elements LD1 may be disposed in a left lower area of the emission area EA. Second light emitting elements LD2 may be disposed in a left upper area of the emission area EA. Third light emitting elements LD3 may be disposed in a right upper area of the emission area EA. Fourth light emitting elements LD4 may be disposed in a right lower area of the emission area EA. Here, the arrangement and/or connection structure of the light emitting elements LD may be changed in various ways depending on the structure of the emission circuit EMU and/or the number of serial stages.

The pixel electrodes ELT may be provided in at least the emission area EA, and each may be provided at a position corresponding to at least one alignment electrode ALE and the light emitting element LD. For example, each pixel electrode ELT may be formed on the corresponding alignment electrode ALE and the corresponding light emitting element LD to overlap the alignment electrode ALE and the light emitting element LD, and thus electrically connected to at least the light emitting element LD. For example, each pixel electrode ELT may be coupled to one end of at least one light emitting element LD in the emission area EA.

The first pixel electrode ELT1 may be formed on a first area (e.g., a lower area) of the first alignment electrode ALE1 and the first ends EP1 of the first light emitting elements LD1, and thus electrically connected to the first ends EP1 of the first light emitting elements LD1. For example, the first pixel electrode ELT1 may be coupled to the first ends EP1 of the first light emitting elements LD1 in the emission area EA.

The second pixel electrode ELT2 may be formed on a first area (e.g., a lower area) of the second alignment electrode ALE2 and the second ends EP2 of the fourth light emitting elements LD4, and thus electrically connected to the second ends EP2 of the fourth light emitting elements LD4. For example, the second pixel electrode ELT2 may be coupled to the second ends EP2 of the fourth light emitting elements LD4 in the emission area EA.

Furthermore, the second pixel electrode ELT2 may be electrically connected to the first, second, and third light emitting elements LD1, LD2, and LD3 via at least another pixel electrode ELT and/or the light emitting element LD. For example, the second pixel electrode ELT2 may be electrically connected to the second ends EP2 of the first light emitting elements LD1 via the third pixel electrode ELT3, the second light emitting element LD2, the fourth pixel electrode ELT4, the third light emitting element LD3, the fifth pixel electrode ELT5, and the fourth light emitting element LD4.

The third pixel electrode ELT3 may be formed on a first area (e.g., a lower area) of the third alignment electrode ALE3 and the second ends EP2 of the first light emitting elements LD1, and thus electrically connected to the second ends EP2 of the first light emitting elements LD1. Furthermore, the third pixel electrode ELT3 may be formed on a second area (e.g., an upper area) of the first alignment electrode ALE1 and the first ends EP1 of the second light emitting elements LD2, and thus electrically connected to the first ends EP1 of the second light emitting elements LD2. For example, the third pixel electrode ELT3 may be coupled, in the emission area EA, to the second ends EP2 of the first light emitting elements LD1 and the first ends EP1 of the second light emitting elements LD2.

To this end, the third pixel electrode ELT3 may have a curved shape. For example, the third pixel electrode ELT3 may have a bent or curved structure in a boundary between an area where at least one first light emitting element LD1 is disposed and an area where at least one second light emitting element LD2 is disposed.

Furthermore, the third pixel electrode ELT3 may be disposed between the first and second pixel electrodes ELT1 and ELT2 and electrically connected between the first and second pixel electrodes ELT1 and ELT2 through the light emitting elements LD. For example, the third pixel electrode ELT3 may be coupled to the first pixel electrode ELT1 through at least one first light emitting element LD1, and coupled to the second pixel electrode ELT2 through at least one second, third, and/or fourth light emitting element LD2, LD3, and/or LD4.

The fourth pixel electrode ELT4 may be formed on a second area (e.g., an upper area) of the third alignment electrode ALE3 and the second ends EP2 of the second light emitting elements LD2, and thus electrically connected to the second ends EP2 of the second light emitting elements LD2. Furthermore, the fourth pixel electrode ELT4 may be formed on a second area (e.g., an upper area) of the fourth alignment electrode ALE4 and the first ends EP1 of the third light emitting elements LD3, and thus electrically connected to the first ends EP1 of the third light emitting elements LD3. For example, the fourth pixel electrode ELT4 may be coupled, in the emission area EA, to the second ends EP2 of the second light emitting elements LD2 and the first ends EP1 of the third light emitting elements LD3.

To this end, the fourth pixel electrode ELT4 may have a curved shape. For example, the fourth pixel electrode ELT4 may have a bent or curved structure in or around a boundary between an area where at least one second light emitting element LD2 is disposed and an area where at least one third light emitting element LD3 is disposed. Although, in an embodiment, the fourth pixel electrode ELT4 may be formed only in the emission area EA rather than extending to the non-emission area NEA, the present disclosure is not limited thereto.

Furthermore, the fourth pixel electrode ELT4 may be electrically connected between the first and second pixel electrodes ELT1 and ELT2 through the light emitting elements LD. For example, the fourth pixel electrode ELT4 may be coupled to the first pixel electrode ELT1 through at least one first and/or second light emitting element LD1 and/or LD2, and coupled to the second pixel electrode ELT2 through at least one third and/or fourth light emitting element LD3, and/or LD4.

The fifth pixel electrode ELT5 may be formed on a second area (e.g., an upper area) of the second alignment electrode ALE2 and the second ends EP2 of the third light emitting elements LD3, and thus electrically connected to the second ends EP2 of the third light emitting elements LD3. Furthermore, the fifth pixel electrode ELT5 may be formed on a first area (e.g., a lower area) of the fourth alignment electrode ALE4 and the first ends EP1 of the fourth light emitting elements LD4, and thus electrically connected to the first ends EP1 of the fourth light emitting elements LD4. For example, the fifth pixel electrode ELT5 may be coupled, in the emission area EA, to the second ends EP2 of the third light emitting elements LD3 and the first ends EP1 of the fourth light emitting elements LD4.

To this end, the fifth pixel electrode ELT5 may have a curved shape. For example, the fifth pixel electrode ELT5 may have a bent or curved structure in a boundary between an area where at least one third light emitting element LD3 is disposed and an area where at least one fourth light emitting element LD4 is disposed.

Furthermore, the fifth pixel electrode ELT5 may be electrically connected between the first and second pixel electrodes ELT1 and ELT2 through the light emitting elements LD. For example, the fifth pixel electrode ELT5 may be coupled to the first pixel electrode ELT1 through at least one first, second, and/or third light emitting element LD1, LD2 and/or LD3, and coupled to the second pixel electrode ELT2 through at least one fourth light emitting element LD4.

In an embodiment of the present disclosure, at least one pixel electrode ELT may extend from the emission area EA to the split area SPA via the non-emission area NEA, and may be coupled to the corresponding alignment electrode ALE through the corresponding hole CH in the split area SPA. For example, the first, second, third, and fifth pixel electrodes ELT1, ELT2, ELT3, and ELT5 may extend from the emission area EA to the split area SPA. In the split area SPA, the first pixel electrode ELT1 may be coupled to the first alignment electrode ALE1 through the first contact hole CH1. The second pixel electrode ELT2 may be coupled to the second alignment electrode ALE2 through the second contact hole CH2. In the split area SPA, the third pixel electrode ELT3 may be coupled to the third alignment electrode ALE3 through the third contact hole CH3. The fifth pixel electrode ELT5 may be coupled to the fourth alignment electrode ALE4 through the fourth contact hole CH4.

As described above, the light emitting elements LD aligned between the alignment electrodes ALE and/or the patterns BNP corresponding thereto may be coupled in a desired shape by using the pixel electrodes ELT. For example, the first light emitting elements LD1, the second light emitting elements LD2, the third light emitting elements LD3, and the fourth light emitting elements LD4 may be successively coupled in series by using the pixel electrodes ELT.

To enhance an application rate of the light emitting elements LD supplied to each emission area EA, the light emitting elements LD may be aligned such that the number (or rate) of light emitting elements LD aligned in a desired alignment direction in each emission area EA can be increased by adjusting alignment signals for aligning the light emitting elements LD or forming an electric field, or the like. In this case, the number of light emitting elements LD coupled in the desired alignment direction using the pixel electrodes ELT may be increased. Therefore, the application rate of the light emitting elements LD may be increased, and the light efficiency of the pixel PXL may be enhanced.

In an embodiment, each pixel electrode ELT may be directly formed on the first or second ends EP1 or EP2 of the light emitting elements LD adjacent thereto, and thus coupled to the first or second ends EP1 or EP2 of the light emitting elements LD.

The pixel electrodes ELT and the alignment electrodes ALE may be coupled through the respective contact holes CH in the outside of the emission area EA (e.g., the split area SPA). In this case, the contact holes CH are formed outside the emission area EA in which the light emitting elements LD are supplied and aligned, so that a more uniform electric field may be formed in the emission area EA at the step of aligning the light emitting elements LD may be formed, and the light emitting elements LD may be prevented from being removed from the desired positions.

The bank BNK may be provided in the non-emission area NEA to enclose the emission area EA and the split area SPA. Furthermore, the bank BNK may be provided in a peripheral portion of each pixel area PXA and/or between adjacent pixel areas PXA such that the bank BNK includes a plurality of openings OPA corresponding to the emission areas EA and the split areas SPA. For example, the bank BNK may include, in each pixel area PXA, a first opening OPA1 corresponding to the emission area EA, and a second opening OPA2 corresponding to the split area SPA.

The bank BNK may form a dam structure for defining each emission area EA to which the light emitting elements LD are to be supplied at the step of supplying the light emitting elements LD to each pixel PXL. For example, because each emission area EA is defined by the bank BNK, a desired kind and/or amount of light emitting element in an ink can be supplied to the emission area EA.

The bank BNK may include at least one light shielding and/or reflective material, and thus prevent light leakage between adjacent pixels PXL from occurring. For example, the bank BNK may include at least one black matrix material and/or color filter material. For instance, the bank BNK may be formed of a black opaque pattern that can block transmission of light. In an embodiment, a reflective layer or the like may be formed on a surface (e.g., a sidewall) of the bank BNK to increase the light efficiency of each pixel PXL.

The bank BNK may be formed at a layer different from that of the patterns BNP through a separate process different from a process of forming the patterns BNP. For example, the bank BNK may be formed over an insulating layer (e.g., the first insulating layer INS1 and/or the second insulating layer INS2 of FIGS. 6A and 6B) provided on the patterns BNP and the alignment electrodes ALE.

The bank BNK may be provided on a layer identical with or different from that of the patterns BNP, and may be formed concurrently (e.g., formed simultaneously) or successively with the patterns BNP. In the case where the bank BNK and the patterns BNP are successively formed, the positions and/or formation sequence of the bank BNK and the patterns BNP are not particularly limited. Furthermore, the bank BNK may be formed integrally with the patterns BNP or separately from the patterns BNP.

In an embodiment, the patterns BNP may be first formed on one surface of the base layer BSL. Thereafter, the alignment electrodes ALE and the bank BNK may be successively formed on the one surface of the base layer BSL on which the patterns BNP have been formed.

In an embodiment, the alignment electrodes ALE may be first formed on one surface of the base layer BSL. Thereafter, the patterns BNP and the bank BNK may be concurrently (e.g., simultaneously) or successively formed on the one surface of the base layer BSL on which the alignment electrodes ALE have been formed.

In an embodiment, the patterns BNP and the bank BNK may be first formed on one surface of the base layer BSL. Thereafter, the alignment electrodes ALE may be formed on the one surface of the base layer BSL on which the patterns BNP and the bank BNK have been formed.

In the case where the patterns BNP and the bank BNK are concurrently formed (or simultaneously formed), the patterns BNP and the bank BNK may be coupled to each other or separated from each other. For example, the patterns BNP and the bank BNK may be integrally formed such that lower surfaces thereof or the like are coupled to each other. Alternatively, the patterns BNP and the bank BNK are concurrently formed (e.g., simultaneously formed), the patterns BNP and the bank BNK may be separated from each other. For example, the patterns BNP and the bank BNK may be concurrently formed (e.g., simultaneously formed) on the same layer, and each may have an independent pattern and may be separated from the other.

In an embodiment, the pixel PXL may further include a second insulating layer INS2 (or an insulating pattern). The second insulating layer INS2 may fix the aligned light emitting elements LD in place. To this end, as illustrated in FIGS. 5A and 5B, the second insulating layer INS2 may be disposed between the pixel electrodes ELT in the emission area EA, and overlap the light emitting elements LD in a plan view. Although will be described with reference to FIGS. 7A-7D, the pixel electrodes ELT in the emission area EA are separated from each other based on the second insulating layer INS2, so that the second insulating layer INS2 in the emission area EA and the non-emission area NEA may come into contact with at least some of the pixel electrodes ELT, but the pixel electrodes ELT may not overlap the second insulating layer INS2 in a plan view.

The second insulating layer INS2 may have an expanded width in one area of the emission area EA (e.g., in the perimeter of the emission area EA). In this case, during a cleaning process of removing fecula of the second insulating layer INS2 after the second insulating layer INS2 is formed, the second insulating layer INS2 may be prevented from being separated from the display panel DP, and the aligned light emitting elements LD may be prevented from being removed from the aligned positions by separation of the second insulating layer INS2. In other words, the second insulating layer INS2 may include a fastener configured to fix the light emitting elements LD in place, and a support configured to prevent the fastener from peeling.

In some embodiments, the second insulating layer INS2 may include a first insulating pattern INS2-1, a second insulating pattern INS2-2, and a third insulating pattern INS2-3.

The first insulating pattern INS2-1 may include a first part INS2-1a (or a fastener) that extends in the second direction DR2 between the first pattern BNP1 and the second pattern BNP2, and a second part INS2-1b (or a support) which extends from the first part INS2-1a in the first direction DR1.

As illustrated in FIG. 5B, the first part INS2-1a may be disposed between the first pattern BNP1 and the second pattern BNP2, and have a width (i.e., a width with respect to the first direction DR1) less than the first distance between the first pattern BNP1 and the second pattern BNP2, and may not overlap the first pattern BNP1 and the second pattern BNP2, in a plan view.

The second part INS2-1b may extend from an end (or an end area) of the first part INS2-1a in the first direction DR1, and have a width greater than that of the first part INS2-1a. The second part INS2-1b may extend to the non-emission area NEA. As the surface area of the second part INS2-1b increases, the first insulating pattern INS2-1 including the first part INS2-1a may be more effectively prevented from peeling during a process of forming the second insulating layer INS2 and/or a subsequent fabricating process.

The second insulating pattern INS2-2 may be substantially symmetrical with the first insulating pattern INS2-1 based on the second pattern BNP2. Hence, description of the second insulating pattern INS2-2 will be omitted.

The third insulating pattern INS2-3 may be spaced from the first and second insulating patterns INS2-1 and INS2-2 by a suitable distance (e.g., a set or predetermined distance) or more. For example, the third insulating pattern INS2-3 may be spaced from the first and second insulating patterns INS2-1 and INS2-2 by a distance greater than a line width of the pixel electrodes ELT such that the third insulating pattern INS2-3 does not overlap the pixel electrodes ELT in a plan view. The third insulating pattern INS2-3 may include a third opening OPA3 to allow a process of separating one alignment electrode ALE to be performed. In an embodiment, the third insulating pattern INS2-3 may be omitted.

The first insulating pattern INS2-1, the second insulating pattern INS2-2, and the third insulating pattern INS2-3 may be formed on an identical layer during an identical process. For example, the first insulating pattern INS2-1, the second insulating pattern INS2-2, and the third insulating pattern INS2-3 may be formed by forming an insulating layer including the first insulating pattern INS2-1, the second insulating pattern INS2-2, and the third insulating pattern INS2-3 on an overall surface of the base layer (refer to "BSL" of FIG. 2) after the light emitting elements LD are aligned, and then patterning the insulating layer.

In some embodiments, in a plan view, only two of the patterns BNP, the bank BNK, and the second insulating layer INS2 may overlap each other. In other words, in a plan view, all of the patterns BNP, the bank BNK, and the second insulating layer INS2 may not overlap each other (at one time in one area).

As illustrated in FIG. 5B, the first insulating pattern INS2-1 may overlap (e.g., overlap only) the first pattern BNP1 among the patterns BNP, the bank BNK, and the second insulating layer INS2 in the emission area EA, and overlap (e.g., overlap only) the bank BNK in the non-emission area NEA. Likewise, the second insulating pattern INS2-2 may overlap (e.g., overlap only) the third pattern BNP3 in the emission area EA, and overlap (e.g., overlap only) the bank BNK in the non-emission area NEA. The third insulating pattern INS2-3 may partially overlap the first pattern BNP1 and the third pattern BNP3 in the emission area EA, and overlap (e.g., overlap only) the bank BNK in the non-emission area NEA. Each of the first pattern BNP1, the second pattern BNP2, and the third pattern BNP3 may overlap (e.g., overlap only) the bank BNK in the non-emission area NEA but not overlap the second insulating layer INS2.

In an embodiment, in a plan view, the second insulating layer INS2 may be spaced from an overlap area where the patterns BNP and the bank BNK overlap each other. Here, the distance by which the second insulating layer INS2 is spaced from the overlap area may be greater than the line width of the pixel electrodes ELT. For example, the first insulating pattern INS2-1 may be spaced from an overlap area where the first pattern BNP1 and the bank BNK overlap each other by a distance greater than the line width of the first pixel electrode ELT1. In other words, because in a plan view the second insulating layer INS2 is spaced from the overlap area where the patterns BNP and the bank BNK overlap each other, space in which the pixel electrodes ELT (e.g., pixel electrodes ELT each having only one organic layer in the bottom thereof) are disposed may be secured.

In an embodiment, only a single organic layer may be disposed under the pixel electrodes ELT. Here, the single organic layer may be one of the patterns BNP, the bank BNK, and the second insulating layer INS2 or be formed of the one. In other words, multiple organic layers formed of two or more of the patterns BNP, the bank BNK, and the second insulating layer INS2 may not be disposed under the pixel electrodes ELT. In other words, in a plan view, the pixel electrodes ELT may not overlap an overlap area where at least two of the patterns BNP, the bank BNK, and the second insulating layer INS2 overlap each other, or may be spaced from the overlap area.

As illustrated in FIGS. 5A and 5B, the first pixel electrode ELT1 may overlap (e.g., overlap only) the first pattern BNP1 among the patterns BNP, the bank BNK, and the second insulating layer INS2 in the emission area EA, overlap (e.g., overlap only) the bank BNK in the non-emission area NEA, and overlap (e.g., overlap only) the second insulating layer INS2 in the opening area SPA. The second pixel electrode ELT2 may partially overlap the second pattern BNP2 and the third pattern BNP3 in the emission area EA, overlap (e.g., overlap only) the bank BNK in the non-emission area NEA, and overlap (e.g., overlap only) the second insulating layer INS2 in the opening area SPA. In a manner as the second pixel electrode ELT2, the third pixel electrode ELT3 may partially overlap each of the second pattern BNP2 and the first pattern BNP1 in the emission area EA, overlap (e.g., overlap only) the bank BNK in the non-emission area NEA, and overlap (e.g., overlap only) the second insulating layer INS2 in the opening area SPA. In a manner as the first pixel electrode ELT1, the fifth pixel electrode ELT5 may overlap (overlap only) the third pattern BNP3, overlap (e.g., overlap only) the bank BNK in the non-emission area NEA, and overlap (e.g., overlap only) the second insulating layer INS2 in the opening area SPA.

For reference, although will be described with reference to FIG. 8B, in the case where the pixel electrodes ELT are disposed in a first overlap area where two of the patterns BNP, the bank BNK, and the second insulating layer INS2 overlap each other, the pixel electrodes ELT may be open in the first overlap area during a process (refer to FIGS. 7A-7D) of forming the pixel electrodes ELT using a halftone exposure (or an exposure or photo process using a halftone mask), because of a relatively large thickness of the organic layer in the first overlap area. Hence, only a single organic layer is disposed under the pixel electrodes ELT, so that a defect (particularly, an open defect) may be prevented from occurring on the pixel electrodes ELT.

Furthermore, when a second overlap area in which all of the patterns BNP, the bank BNK, and the second insulating layer INS2 overlap each other is present, a mask (e.g., a photoresist pattern) for patterning the pixel electrodes ELT may not be formed, and the pixel electrodes ELT may be open in the second overlap area. Even when the photoresist pattern is formed in the second overlap area, if the photoresist pattern is not correctly formed or removed in an area that does not protrude higher than the second overlap area, fecula of the pixel electrodes ELT may occur, so that a short-circuit may occur between the pixel electrodes ELT due to the fecula. Therefore, a defect (for example, an open defect or a short-circuit defect) may be prevented from occurring, by removing an area where all of the patterns BNP, the bank BNK, and the second insulating layer INS2 overlap each other, in other words, by overlapping only two of the patterns BNP, the bank BNK, and the second insulating layer INS2 with each other.

The pixel electrodes ELT may extend and bypass the multiple organic layers so that only the single organic layer can be disposed under the pixel electrodes ELT. Here, the multiple organic layers may include two of the patterns BNP, the bank BNK, and the second insulating layer INS2 or be formed of the two.

As illustrated in FIG. 5A, the first pixel electrode ELT1 may include a third part corresponding to the first part INS2-1a of the first insulating pattern INS2-1 and extending in the second direction DR2, and a fourth part extending in the first direction DR1 to bypass an overlap area of the second part INS2-1b of the first insulating pattern INS2-1 and the organic layers (i.e., an overlap area of the second part INS2-1b and the first pattern BNP1, and an overlap area of the second part INS2-1b and the bank BNK). For example, the fourth part of the first pixel electrode ELT1 may extend to the non-emission area NEA in the first direction DR1. Likewise, the third pixel electrode ELT3 may extend in the second direction DR2 while corresponding to the first part INS2-1a of the first insulating pattern INS2-1, and extend in the first direction DR1 or have a curved shape to bypass the overlap area of the second part INS2-1b of the first insulating pattern INS2-1 and the organic layers (i.e., the overlap area of the second part INS2-1b and the first pattern BNP1, and an overlap area of the first pattern BNP1 and the bank BNK). A shape of the second pixel electrode ELT2 and a shape of the fifth pixel electrode ELT5 may correspond to the shape of the third pixel electrode ELT3 and the shape of the first pixel electrode ELT1.

As described above, the second insulating layer INS2 may prevent the light emitting elements LD from being removed from the aligned positions thereof. The support of the second insulating layer INS2 (e.g., the second part INS2-1b of the first insulating pattern INS2-1) may prevent the second insulating layer INS2 from peeling during a process of forming the second insulating layer INS2 and/or a subsequent fabricating process.

Furthermore, only two of the patterns BNP, the bank BNK, and the second insulating layer INS2 may overlap each other (i.e., all of the patterns BNP, the bank BNK, and the second insulating layer INS2 do not overlap each other). Only a single organic layer (i.e., one of the patterns BNP, the bank BNK, and the second insulating layer INS2) may be disposed under the pixel electrodes ELT. To this end, the support of the second insulating layer INS2 (e.g., the second part INS2-1b of the first insulating pattern INS2-1) may have a shape bypassing an overlap area of the patterns BNP and the bank BNK. The pixel electrodes ELT may have, in the emission area EA, a shape bypassing the multiple organic layers (for example, the support of the second insulating layer INS2, e.g., the second part INS2-1b of the first insulating pattern INS2-1). In this case, even in the area where the multiple organic layers are formed, a mask to be used to form the pixel electrodes ELT may be normally formed, and the pixel electrodes ELT may not protrude upward to a set height (e.g., a predetermined height) or more. Therefore, during a process of the pixel electrodes ELT using a halftone exposure scheme, a defect (e.g., an open defect, or a short-circuit resulting from fecula) may be prevented from occurring in the pixel electrodes ELT. Thus, the yield of the display device DD may be improved.

Figure 6A:
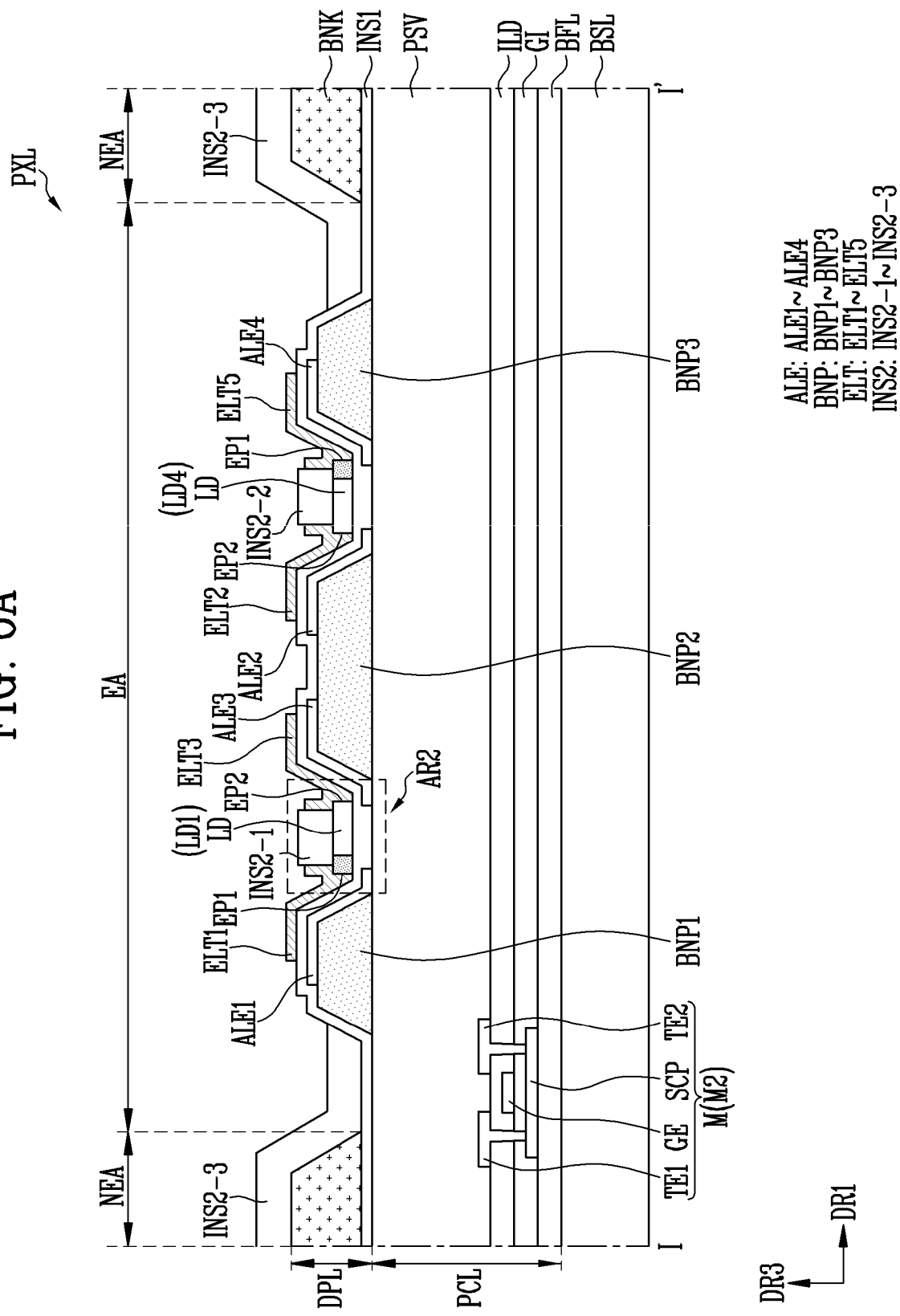
FIG. 6A is a sectional view illustrating the pixel of FIG. 4, taken along the line I-I' of FIG. 5A.
Figure 6B:
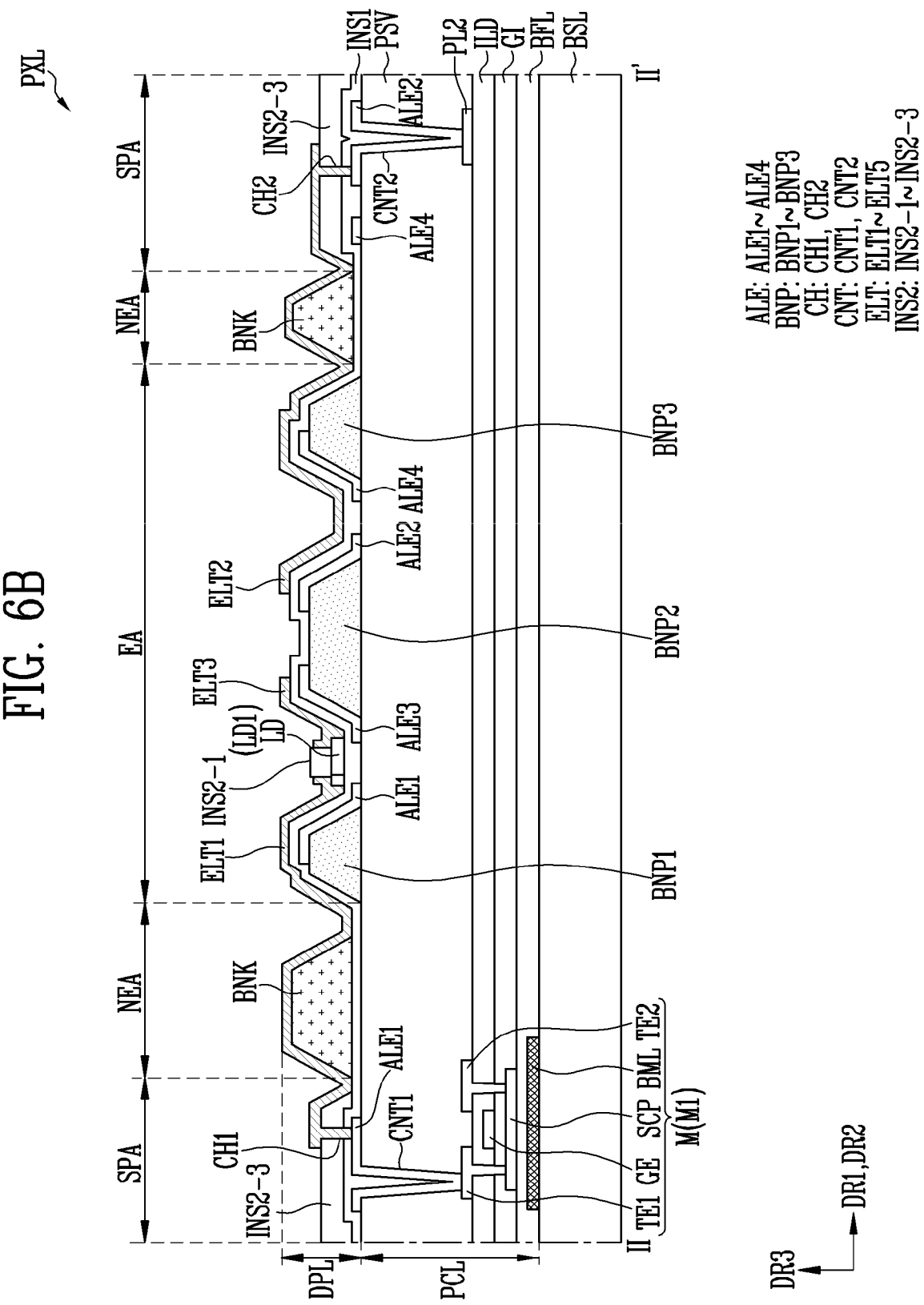
FIG. 6B is a sectional view illustrating the pixel of FIG. 4, taken along the line II-II' of FIG. 5A.
Figure 6C:
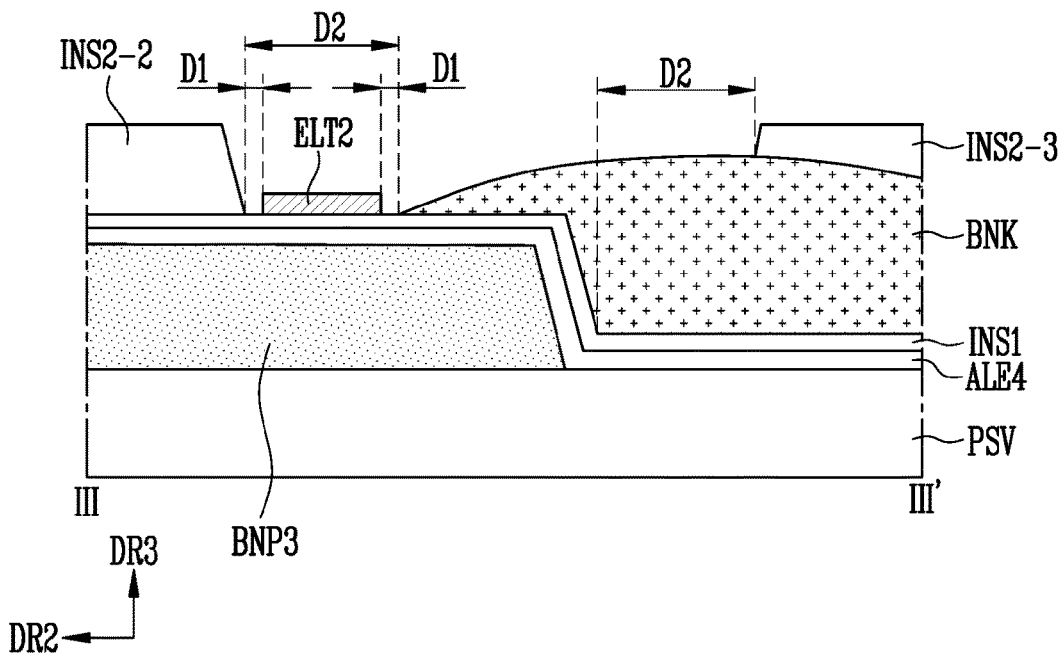
FIG. 6C is a sectional view illustrating the pixel of FIG. 4, taken along the line III-III' of FIG. 5A.
Figure 6D:
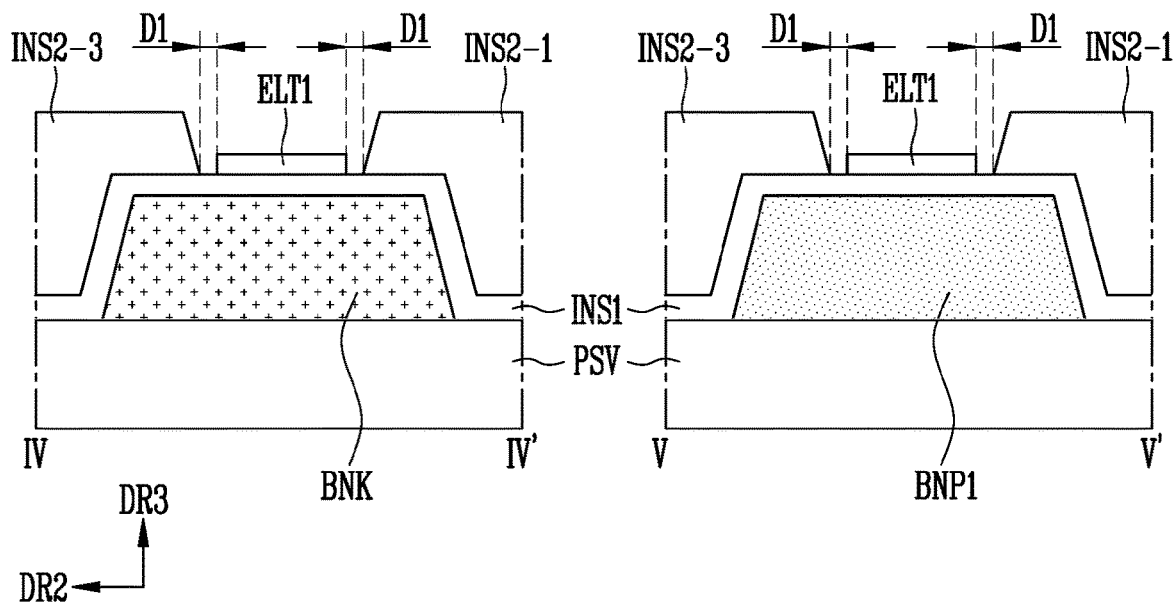
FIG. 6D is a sectional view illustrating the pixel of FIG. 4, taken along the line IV-IV' and the line V-V' of FIG. 5A.

FIG. 6A is a sectional view illustrating the pixel PXL, taken along the line I-I' of FIG. 5A. FIG. 6A illustrates, as an example of circuit elements that can be disposed on a circuit layer PCL, any transistor M (e.g., the second transistor M2 of FIGS. 3A-3C) that does not include the bottom metal layer BML. FIG. 6B is a sectional view illustrating the pixel PXL, taken along the line II-II' of FIG. 5A. FIG. 6B illustrates a cross-section of the pixel PXL including the contactor CNT and the contact holes CH1 and CH2. Furthermore, FIG. 6B illustrates, as an example of circuit elements that can be disposed on the circuit layer PCL, a transistor M (e.g., the first transistor M1 of FIG. 3A-3C) that is coupled to the first alignment electrode ALE1 through the first contactor CNT1 and includes the bottom metal layer BML, and illustrates, as an example of a line that can be disposed on the circuit layer PCL, the second power line PL2 coupled to the second alignment electrode ALE2 through the second contactor CNT2. FIG. 6C is a sectional view illustrating the pixel PXL, taken along the line III-III' of FIG. 5A. FIG. 6D is a sectional view illustrating the pixel PXL, taken along the line IV-IV' and line V-V' of FIG. 5A. FIGS. 6C and 6D schematically illustrate the pixel PXL, centered on disposition relationship between the patterns BNP1 and BNP3, the bank BNK, and the second insulating layer INS2 (and the pixel electrodes ELT).

Referring to FIGS. 2, 3A-3C, 4, 5A, 5B, and 6A-6D, the pixel PXL and the display device (refer to "DD" in FIG. 2) including the pixel PXL may include a circuit layer PCL and a display layer DPL that are disposed on one surface of the base layer BSL and overlap each other. For example, the display area DA may include the circuit layer PCL disposed on the one surface of the base layer BSL, and the display layer DPL disposed on the circuit layer PCL. However, relative positions of the circuit layer PCL and the display layer DPL on the base layer BSL may be changed depending on embodiments. In the case where the circuit layer PCL and the display layer DPL overlap each other on different layers, respective layout spaces required to form the pixel circuit (refer to "PXC" in FIGS. 3A-3C) and the emission circuit (refer to "EMU" of FIGS. 3A-3C) may be reliably secured in a plan view.

In each pixel area PXA of the circuit layer PCL, circuit elements (e.g., transistors M and a storage capacitor (refer to "Cst" in FIGS. 3A-3D)) for forming the pixel circuit PXC of the corresponding pixel PXL and various lines coupled to the circuit elements may be disposed. In each pixel area PXA of the display layer DPL, the alignment electrodes ALE, the light emitting elements LD, and/or the pixel electrodes ELT that form the emission circuit EMU of the corresponding pixel PXL may be disposed.

The circuit layer PCL may include a plurality of insulating layers (or insulating films), as well as including the circuit elements and the lines. For example, the circuit layer PCL may include a buffer layer BFL, a gate insulating layer GI, an interlayer insulating layer ILD, and/or a passivation layer PSV that are successively stacked on one surface of the base layer BSL.

The circuit layer PCL may selectively further include a first conductive layer including a bottom metal layer BML, etc. that are disposed under at least a transistor M (e.g., the first transistor M1).

For example, the first conductive layer may be disposed between the base layer BSL and the buffer layer BFL, and include a bottom metal layer BML that overlaps a semiconductor pattern SCP and/or a gate electrode GE of at least one transistor M (e.g., the first transistor M1) in a third direction DR3.

In an embodiment, the bottom metal layer BML may be coupled to one electrode of the corresponding transistor M. For example, when the first transistor M1 includes the bottom metal layer BML, the bottom metal layer BML may be coupled to the source electrode (or the drain electrode) of the first transistor M1.

The buffer layer BFL may be disposed on the one surface of the base layer BSL on which the first conductive layer is selectively formed. The buffer layer BFL may prevent impurities from diffusing into each circuit element. The buffer layer BFL may also cover the first conductive layer (e.g., the bottom metal layer BML).

A semiconductor layer may be disposed on the buffer layer BFL. The semiconductor layer may include, e.g., a semiconductor pattern SCP of each transistor M. The semiconductor pattern SCP may include a channel area that overlaps the gate electrode GE in the third direction DR3, and first and second conductive areas (e.g., source and drain areas) disposed on opposite sides of the channel area.

A gate insulating layer GI may be disposed on the semiconductor layer. A second conductive layer may be disposed on the gate insulating layer GI.

The second conductive layer may include the gate electrode GE of each transistor M. Furthermore, the second conductive layer may further include one electrode of the storage capacitor Cst and/or a line (e.g., a set or predetermined line).

An interlayer insulating layer ILD may be disposed on the second conductive layer. A third conductive layer may be disposed on the interlayer insulating layer ILD.

The third conductive layer may include the first and second transistor electrodes TE1 and TE2 of each transistor M. Here, the first and second transistor electrodes TE1 and TE2 may be source and drain electrodes. One of the first and second transistor electrodes TE1 and TE2, e.g., the first transistor electrode TE1 of the first transistor M1, may be directly coupled to the first alignment electrode ALE1 and/or the first pixel electrode ELT1 of each emission circuit EMU through the first contactor CNT1.

Furthermore, the third conductive layer may include a line (e.g., a set or predetermined line) (e.g., the second power line PL2 and/or the first power line (refer to "PL1" of FIGS. 3A-3C)).

The second power line PL2 may be coupled to the second alignment electrode ALE2 and/or the second pixel electrode ELT2 of each light emitter EMU through the second contactor CNT2. Each of the first and second contactors CNT1 and CNT2 may be formed of a via hole and/or a contact hole formed in the passivation layer PSV.

In an embodiment, an additional interlayer insulating layer may be disposed on the third conductive layer, and a fourth conductive layer may be disposed on the additional interlayer insulating layer. In this case, the line (e.g., the set or predetermined line) may be disposed on the fourth conductive layer. Furthermore, a bridge pattern may be provided on the fourth conductive layer. The first alignment electrode ALE1 may be coupled to the first transistor electrode TE1 (or the second transistor electrode TE2) of the first transistor M1 through the first contactor CNT1 and the bridge pattern.

The position of the first and/or second power lines PL1 and/or PL2 may be changed in various ways depending on embodiments. For example, each of the first and second power lines PL1 and PL2 may be provided on the first conductive layer, the second conductive layer, or the third conductive layer. Furthermore, in the case where the first and/or second power line PL1 and/or PL2 are formed of multiple layers, the first and/or second power line PL1 and/or PL2 may include multilayered lines provided on at least two of the first to third conductive layers.

The passivation layer PSV may be disposed on the third conductive layer. In an embodiment, the passivation layer PSV may include at least an organic insulating layer and substantially planarize the surface of the circuit layer PCL. The display layer DPL may be disposed over the passivation layer PSV.

The display layer DPL may include an emission circuit EMU of each pixel PXL. For example, the display layer DPL may include alignment electrodes ALE of each pixel PXL, light emitting elements LD aligned between the alignment electrodes ALE, and pixel electrodes ELT coupled to the light emitting elements LD. In an embodiment, at least some of the pixel electrodes ELT may be coupled to the respective different alignment electrodes ALE through the respective contact holes CH formed in the first insulating layer INS1. The first insulating layer INS1 may include inorganic material, but the present disclosure is not limited thereto.

Furthermore, the display layer DPL may include the patterns BNP disposed under the alignment electrodes ALE, and the first insulating layer INS1 disposed over the alignment electrodes ALE. For example, the display layer DPL may include the patterns BNP which are disposed under respective predetermined areas of the alignment electrodes ALE to protrude the predetermined areas of the alignment electrodes ALE, and the first insulating layer INS1 disposed over the alignment electrodes ALE to cover the overall surfaces of the alignment electrodes ALE in at least the emission area EA. In addition, the display layer DPL may further include at least one conductive layer and/or insulating layer.

For example, the display layer DPL may include the patterns BNP, the alignment electrodes ALE, the first insulating layer INS1, the light emitting elements LD, the second insulating layer INS2, and the pixel electrodes ELT that are successively disposed and/or formed over the circuit layer PCL.

In an embodiment, as illustrated in FIGS. 6A and 6B, a pair of pixel electrodes ELT (e.g., the first and third pixel electrodes ELT1 and ELT3 or the second and fifth pixel electrodes ELT2 and ELT5) that face each other with each light emitting element LD interposed therebetween may be formed at an identical layer. For example, the pixel electrodes ELT of each pixel PXL may be concurrently formed (e.g., simultaneously formed) at an identical layer. A method of forming the pixel electrodes ELT will be described below with reference to FIGS. 7A-7D.

The patterns BNP may be disposed on one surface of the base layer BSL on which the circuit layer PCL is formed. For example, the patterns BNP may be provided over the passivation layer PSV. The patterns BNP may protrude from one surface of the base layer BSL in the height direction or thickness direction (e.g., in the third direction DR3) of the pixel PXL. Hence, the respective areas (e.g., respective set or predetermined areas) of the alignment electrodes ALE disposed on the patterns BNP may protrude upward.

The patterns BNP may include insulating material including at least one inorganic material and/or organic material. For example, the patterns BNP may include at least one inorganic layer including various inorganic insulating materials such as silicon nitride ($SiN_x$), silicon oxide ($SiO_x$), silicon oxynitride ($SiO_xN_y$). Alternatively, the patterns BNP may include at least one organic layer having various organic insulating materials including photoresist material, or may be formed of an insulator having a single- or multi-layer structure including a combination of organic/inorganic materials.

A reflective wall structure may be formed around the light emitting elements LD by the patterns BNP and the alignment electrodes ALE disposed on the patterns BNP. For example, in the case where each of the alignment electrodes ALE include a reflective electrode layer, light emitted from the first and second ends EP1 and EP2 of the light emitting elements LD may be reflected by the reflective electrode layer and emitted upward from each pixel PXL.

The patterns BNP may have various shapes. In an embodiment, the patterns BNP may have an inclined surface that is inclined at an angle within a suitable range (e.g., a set or predetermined range) with respect to the base layer BSL, as illustrated in FIGS. 6A and 6B. In an embodiment, the patterns BNP may have sidewalls each having a shape such as a curved shape or a stepped shape. For example, at least one pattern BNP may have a cross-section such as a semi-circular shape or a semi-elliptical shape, as illustrated in FIG. 6C. Conductive layers (or electrodes) and/or insulating layers that are disposed over the patterns BNP may have surface profiles corresponding to that of the patterns BNP.

The alignment electrodes ALE may be disposed over the patterns BNP. The alignment electrodes ALE may be spaced from each other in each emission area EA in the first direction DR1.

In an embodiment, each alignment electrode ALE may have a pattern divided by pixels PXL, or a pattern coupled in common in a plurality of pixels PXL. For example, each of the first to fourth alignment electrodes ALE1 to ALE4 may have an independent pattern in which the opposite ends thereof are cut off in the split area (refer to "SPA" of FIG. 4) disposed around the perimeter of the corresponding pixel area PXA and/or between adjacent pixel areas PXA. In an embodiment, at least one alignment (e.g., the first alignment electrode ALE1) may have an independent pattern in which the opposite ends thereof are cut off in the split area SPA, etc., and at least another alignment electrode (e.g., the second alignment electrode ALE2) may extend in the first direction DR1 or the second direction DR2 and may be integrally coupled to an alignment electrode (e.g., a set or predetermined alignment electrode) of an adjacent another pixel PXL (e.g., the second alignment electrode ALE2 of the adjacent pixel PXL) with respect to the first direction DR1 or the second direction DR2.

Each alignment electrode ALE may include at least one conductive material and thus have conductivity. Furthermore, the alignment electrodes ALE may include identical or different conductive materials. Each alignment electrode ALE may be formed of a single layer or multiple layers.

The first insulating layer INS1 may be disposed on one surface of the base layer BSL including the alignment electrodes ALE. For example, the first insulating layer INS1 may be interposed between the alignment electrodes ALE and the pixel electrodes ELT.

The first insulating layer INS1 may be formed to completely cover the alignment electrodes ALE in the emission area EA. Furthermore, the first insulating layer INS1 may have, in the split area SPA, contact holes CH that expose respective areas (e.g., respective set or predetermined areas) of the alignment electrodes ALE.

The bank BNK may be disposed on one surface of the base layer BSL including the first insulating layer INS1. For example, the bank BNK may be provided in the non-emission area NEA to enclose the emission area EA and the split area SPA.

The bank BNK may be provided to overlap or not overlap the first and/or second contactor CNT1 and/or CNT2. The bank BNK may be provided not to overlap the contact holes CH. In this case, after the bank BNK has been formed, the alignment electrodes ALE may be coupled to the respective pixel electrodes ELT.

The bank BNK may include insulating material including at least one inorganic material and/or organic material. In an embodiment, the bank BNK may include light shielding material, color filter material, or the like so that light leakage may be prevented from occurring between adjacent pixels PXL. Furthermore, the bank BNK may include at least one of materials that constitute the patterns BNP, or include material different from that of the patterns BNP.

In an embodiment, the bank BNK may have a hydrophobic surface. For example, the bank BNK itself may be formed of a hydrophobic pattern using hydrophobic material, or a hydrophobic film made of hydrophobic material may be formed on the bank BNK, so that the bank BNK may be formed to have the hydrophobic surface. For instance, the bank BNK may be formed using organic insulating material such as polyacrylate having hydrophobicity with a large contact angle. In this case, ink (e.g., light emitting element ink) including the light emitting elements LD may be prevented from overflowing into the perimeter of the emission area EA during a process of supplying the light emitting elements LD. Furthermore, an area to which the light emitting element ink is to be supplied may be easily controlled.

Although FIGS. 6A and 6B illustrate the structure of the pixel PXL centered on an embodiment where the patterns BNP, the alignment electrodes ALE, the first insulating layer INS1, and the bank BNK are successively formed on one surface of the base layer BSL, the present disclosure is not limited thereto. For example, after the alignment electrodes ALE are first formed on the one surface of the base layer BSL on which the circuit layer PCL has been formed, the patterns BNP, the first insulating layer INS1, and the bank BNK may be successively formed. In an embodiment, the patterns BNP may be integrally formed with the passivation layer PSV.

In other words, in the present disclosure, the position, the formation sequence, and/or the shape of the patterns BNP, the alignment electrodes ALE, the first insulating layer INS1, and/or the bank BNK is not particularly limited, and may be changed in various ways depending on embodiments.

The light emitting elements LD may be supplied and aligned in each emission area EMA. In an embodiment, a plurality of light emitting elements LD may be supplied to the emission area EA of each pixel PXL by an inkjet scheme, a slit coating scheme, or various other schemes. The light emitting elements LD may be aligned between the alignment electrodes ALE by applying an alignment signal (e.g., a set or predetermined alignment signal) (or an alignment voltage) to each of the alignment electrodes ALE (the alignment lines before divided into the alignment electrodes ALE). For example, the light emitting elements LD may be aligned in an area between a pair of patterns BNP disposed under a pair of alignment electrodes ALE to be supplied with different alignment signals (e.g., in an area between the first and second patterns BNP1 and BNP2 and an area between the second and third patterns BNP2 and BNP3).

In an embodiment, at least some of the light emitting elements LD may be aligned between a pair of adjacent alignment electrodes ALE in a horizontal direction (or the first direction DR1) or a diagonal direction (e.g., a direction between the first direction DR1 and the second direction DR2) such that the opposite ends of the at least some light emitting elements LD (e.g., the first and second ends EP1 and EP2) overlap or does not overlap the adjacent alignment electrodes ALE. The opposite ends of the light emitting elements LD may be coupled to the respective corresponding pixel electrodes ELT.

The second insulating layer INS2 may be disposed on some areas (e.g., set or predetermined areas) of the light emitting elements LD. The second insulating layer INS2 may be sectionally disposed on the respective areas (e.g., respective set or predetermined areas) of the light emitting elements LD such that the first and second ends EP1 and EP2 of each of the light emitting elements LD are exposed. For example, the first insulating pattern INS2-1 of the second insulating layer INS2 may be sectionally disposed on an area (e.g., a set or predetermined area) of the first light emitting element LD1 such that the first and second ends EP1 and EP2 of the first light emitting element LD1 are exposed. The second insulating pattern INS2-2 of the second insulating layer INS2 may be sectionally disposed on an area (e.g., a set or predetermined area) of the fourth light emitting element LD4 such that the first and second ends EP1 and EP2 of the fourth light emitting element LD4 are exposed. The opposite ends of the light emitting elements LD, i.e., the first and second ends EP1 and EP2, which are not covered with the second insulating layer INS2, may be coupled to the respective corresponding pixel electrodes ELT. If the second insulating layer INS2 is formed on the light emitting elements LD after the alignment of the light emitting elements LD has been completed, the light emitting elements LD may be reliably fixed in place.

The second insulating layer INS2 may include at least one inorganic insulating material and/or organic insulating material. For example, the second insulating layer INS2 may include various types of known organic/inorganic insulating materials including silicon nitride (SiNx). The constituent material of the second insulating layer INS2 is not particularly limited.

The pixel electrodes ELT may be disposed on the first insulating layer INS1 and spaced apart from each other with the second insulating layer INS2 interposed therebetween. The pixel electrodes ELT may be concurrently formed (e.g., simultaneously formed) through an exposure process using a halftone mask. Hence, the pixel electrodes ELT may come into contact with the second insulating layer INS2 and do not overlap the second insulating layer INS2 with respect to the third direction DR3. For example, the first pixel electrode ELT1 and the third pixel electrode ELT3 may be spaced from each other with the first insulating pattern INS2-1, come into contact with a sidewall of the first insulating pattern INS2-1, and do not come into contact with a top surface of the first insulating pattern INS2-1. Likewise, the second pixel electrode ELT2 and the fifth pixel electrode ELT5 may be spaced from each other with the second insulating pattern INS2-2, come into contact with a sidewall of the second insulating pattern INS2-2, and do not come into contact with a top surface of the second insulating pattern INS2-2.

In an embodiment, only one (i.e., a single organic layer) of two or more of the patterns BNP, the bank BNK, and the second insulating layer INS2 may be disposed under the pixel electrodes ELT. In other words, multiple organic layers formed of two or more of the patterns BNP, the bank BNK, and the second insulating layer INS2 may not be disposed under the pixel electrodes ELT. As illustrated in FIG. 6B, on a path along which the first pixel electrode ELT1 extends, the first pixel electrode ELT1 may overlap the bank BNK or the first pattern BNP1. On a path along which the second pixel electrode ELT2 extends, the second pixel electrode ELT2 may overlap the second pattern BNP2, the third pattern BNP3, or the bank BNK.

In an embodiment, the pixel electrodes ELT may be spaced, by a sufficient margin, from an overlap area where the patterns BNP, the bank BNK, and the second insulating layer INS2 overlap each other. As described above, because an open defect of the pixel electrodes ELT may occur in the overlap area, the pixel electrodes ELT may be spaced from the overlap area, taking into account a fabrication error.

For example, as illustrated in FIG. 6C, the second pixel electrode ELT2 may be spaced from the overlap area between the second insulating pattern INS2-2 and the third pattern BNP3 by a first distance D1, and may be spaced from an overlap area between the bank BNK and the third pattern BNP3 by the first direction D1. For example, the first distance D1 may be approximately 1 μm or less. As illustrated in FIG. 6D, the first pixel electrode ELT1 may be spaced, by the first distance D1, from each of an overlap area between the third insulating pattern INS2-3 and the bank BNK, an overlap area between the first insulating pattern INS2-1 and the bank BNK, an overlap area between the third insulating pattern INS2-3 and the first pattern BNP1, and an overlap area between the first insulating pattern INS2-1 and the first pattern BNP1.

To this end, the second insulating layer INS2 may be spaced, by a second distance D2, from an overlap area where the patterns BNP and the bank BNK overlap each other. Here, the second distance D2 may be greater than the sum of a line width of each of the pixel electrodes ELT and the first distance D1. For example, as illustrated in FIG. 6C, the second insulating pattern INS2-2 on the third pattern BNP3 may be spaced from the overlap area between the bank BNK and the third pattern BNP3 by the second distance D2. The third insulating pattern INS2-3 on the bank BNK may be spaced from the overlap area between the bank BNK and the third pattern BNP3 by the second distance D2. As described above, because fecula of the pixel electrodes ELT may occur in the area where all of the patterns BNP, the bank BNK, and the second insulating layer INS2 overlap each other, the second insulating layer INS2 may be disposed at a position spaced by a sufficient distance from the overlap area where the patterns BNP and the bank BNK overlap each other.

The pixel electrodes ELT may be formed of various transparent conductive materials. For example, the pixel electrodes ELT may include at least one of various transparent conductive materials, including ITO, IZO, ITZO, ZnO, AZO, GZO, ZTO, GTO and FTO, and may be substantially transparent or semi-transparent to satisfy a desired transmittance (e.g., a set or predetermined transmittance). Hence, light emitted from the light emitting elements LD through the first and second ends EP1 and EP2 may be emitted out of the pixel PXL through the pixel electrodes ELT.

In an embodiment, at least one insulating layer and/or light conversion layer may be provided on the pixel electrodes ELT.

For example, an insulating layer may be formed on the overall surface of the display area DA to cover upper surfaces of the patterns BNP, the pixel electrodes ELT, the first and second insulating layers INS1 and INS2, the light emitting elements LD, the pixel electrodes ELT, and the bank BNK. In an embodiment, the insulating layer may include an encapsulation layer having a single-layer or multi-layer structure. In some embodiments, at least one overcoat layer, at least one filler, and/or at least one upper substrate, etc., may be further disposed over the insulating layer.

Furthermore, the light conversion layer may be selectively provided on the emission circuit EMU of each pixel PXL. The light conversion layer may include a color conversion layer (or a wavelength conversion layer) and/or a color filter layer corresponding to a desired color (e.g., a set or predetermined color). The light conversion layer may be formed directly on the pixel electrodes ELT of each pixel PXL or form on the insulating layer that covers the pixel electrodes ELT. The position of the light conversion layer and a method of forming the light conversion layer are not particularly limited.

For example, in each pixel area PXA, a light conversion layer may be selectively further provided over the display layer DPL. The light conversion layer may include light conversion particles (e.g., quantum dots corresponding to a desired color (e.g., a set or predetermined color) for converting the color (or the wavelength) of light emitted from the light emitting elements LD, light scattering particles for enhancing the application rate of light emitted from the light emitting elements LD, and/or color filter material corresponding to a desired color (e.g., a set or predetermined color).

In the embodiments of FIGS. 4, 5A, 5B, 6A, and 6B, the emission area EA in which the light emitting elements LD are supplied and aligned may be formed to enhance or optimize alignment characteristics of the light emitting elements LD. For example, in each emission area EA, the emission circuit EMU may be formed such that not only can the light emitting elements LD be uniformly aligned between the alignment electrodes ALE but the light emitting elements LD can also be prevented from being removed from the aligned positions thereof.

For example, in the emission area EA, each pattern BNP may have a uniform width and continuously extend in the second direction DR2, and the patterns BNP may be arranged at regular intervals.

Likewise, in the emission area EA, each alignment electrode ALE may have a uniform width and continuously extend in the second direction DR2. A pair of alignment electrodes ALE (or a pair of alignment lines before divided into the alignment electrodes ALE) to be supplied with different alignment signals may be spaced from each other by a uniform distance.

Furthermore, the first insulating layer INS1 may be formed to uniformly cover the overall surfaces of the alignment electrodes ALE in the emission area EA and partially expose the alignment electrodes ALE through respective contact holes CH in the split area SPA.

Because the contact holes CH is disposed in the split area SPA, at least some of the pixel electrodes ELT, e.g., the first, second, third, and fifth pixel electrodes ELT1, ELT2, ELT3, and ELT5 may extend to the split area SPA. The first, second, third, and fifth pixel electrodes ELT1, ELT2, ELT3, and ELT5 may be coupled to different alignment electrodes ALE through the respective contact holes CH in the split area SPA.

In accordance with the embodiments of FIGS. 4, 5A, 5B, 6A, and 6B, even when the light emitting elements LD are aligned by applying alignment signals including alternating current (AC) signals to the alignment electrodes ALE (or the alignment lines), AC electro-osmosis (ACEO) effect can prevent the light emitting elements LD from being removed from the aligned positions thereof. For example, the emission circuit EMU may be formed such that a uniform electric field is formed between a pair of alignment electrodes ALE. In the emission area EA, after the overall surfaces of the alignment electrodes ALE are covered with the first insulating layer INS1, ink including light emitting elements LD (e.g., light emitting element ink including at least one kind of light emitting elements LD) may be supplied to the emission area EA, and the light emitting elements LD may be aligned by forming an electric field between the alignment electrodes ALE. Hence, the flow of light emitting element ink may be prevented, reduced, or minimized, and removal of the light emitting elements LD from the aligned positions may be prevented, reduced, or minimized.

In accordance with embodiments of FIGS. 4, 5A, 5B, 6A, and 6B, only two of the patterns BNP, the bank BNK, and the second insulating layer INS2 may overlap each other, and only a single organic layer (i.e., one of the patterns BNP, the bank BNK, and the second insulating layer INS2) may be disposed under the pixel electrodes ELT. Furthermore, the pixel electrodes ELT may be spaced, by a sufficient margin (e.g., the first distance D1), from the overlap area where the patterns BNP, the bank BNK, and the second insulating layer INS2 overlap each other. The second insulating layer INS2 may be spaced, by a sufficient margin (e.g., the second distance D2), from the overlap area where the patterns BNP and the bank BNK overlap each other. Therefore, a defect (e.g., a short-circuit defect or an open defect resulting from fecula) may be prevented from occurring in the pixel electrodes ELT.

FIGS. 7A-7D are sectional views illustrating a method of fabricating the pixel PXL of FIG. 6A. FIGS. 7A-7D schematically illustrate a process of forming the pixel electrodes (refer to "ELT" of FIG. 4), centered on area AR2 of FIG. 6A.

Referring to FIGS. 4, 6A, and 7A-7D, the pixel electrodes ELT may be formed using a halftone mask.

Figure 7A:
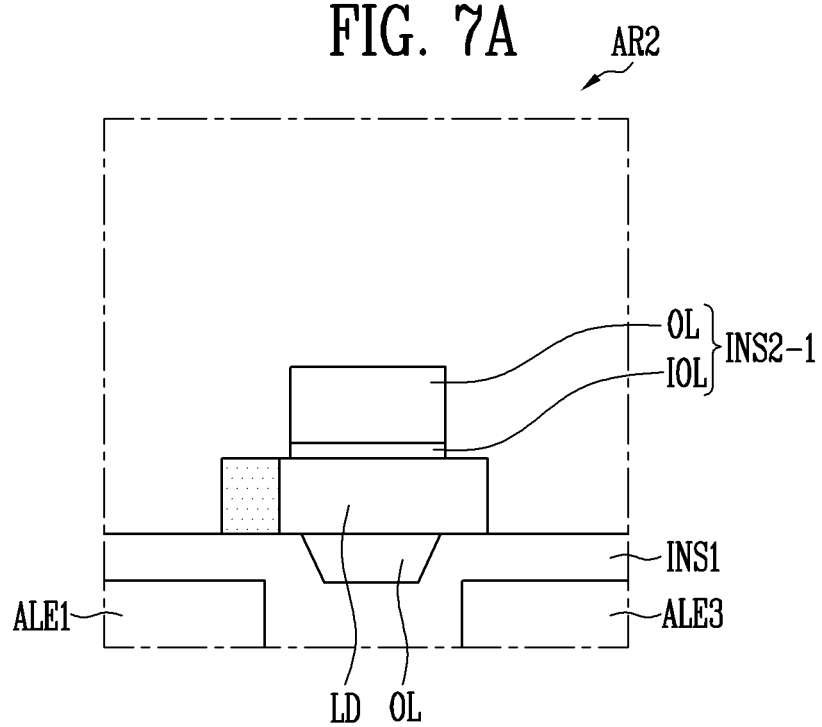
FIGS. 7A-7D are sectional views illustrating a method of fabricating the pixel of FIG. 6A.

As illustrated in FIG. 7A, prepared may be a structure including the first alignment electrode ALE1, the third alignment electrode ALE3, the first insulating layer INS1 disposed on the first and third alignment electrodes ALE1 and ALE3, the light emitting element LD disposed on the first insulating layer INS1, and the first insulating pattern INS2-1 (or, the second insulating layer INS2 of FIG. 6A) disposed on the light emitting elements LD.

The first insulating pattern INS2-1 may include an inorganic insulating layer IOL and an organic insulating layer OL that are successively stacked on the light emitting element LD. The inorganic insulating layer IOL including inorganic material may be disposed between the light emitting element LD and the organic insulating layer OL, and may enhance interface adhesion characteristics of the first insulating pattern INS2-1 with respect to the light emitting element LD and prevent the first insulating pattern INS2-1 from peeling. The organic insulating layer OL including organic material may have a sufficient thickness and may be disposed on the inorganic insulating layer IOL, and reliably separate the pixel electrodes ELT to be thereafter formed. Furthermore, if space is present between the first insulating pattern INS2-1 and the light emitting element LD before the first insulating pattern INS2-1 is formed, the space may be charged with the organic insulating layer OL. Consequently, the light emitting element LD may be more stably supported.

Figure 7B:
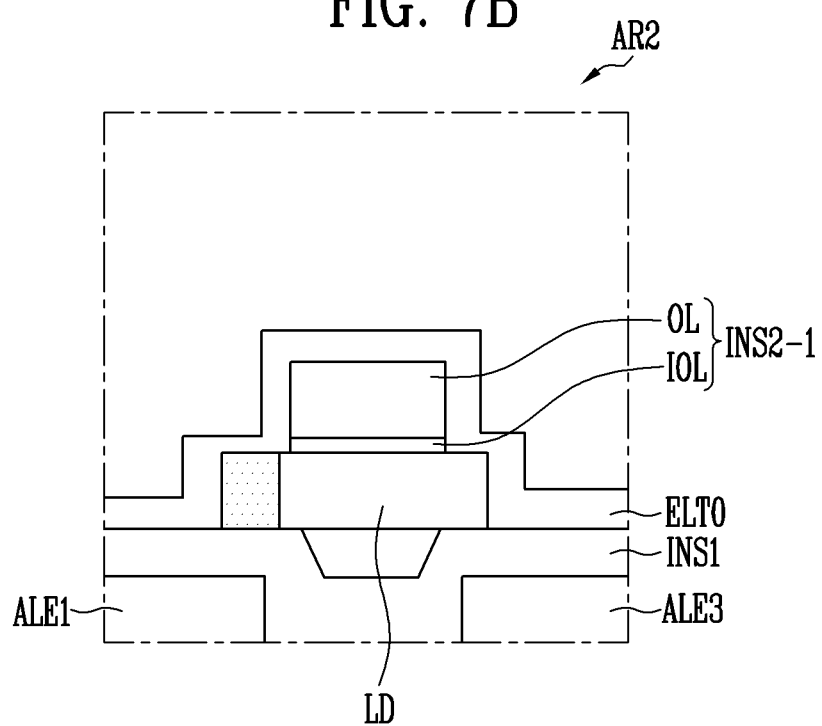

Thereafter, as illustrated in FIG. 7B, a conductive layer ELT0 may be formed on the first insulating layer INS1, the light emitting element LD, and the first insulating pattern INS2-1. The conductive layer ELT0 may be formed on the overall surface of the pixel area (refer to "PXA" of FIG. 4).

Figure 7C:
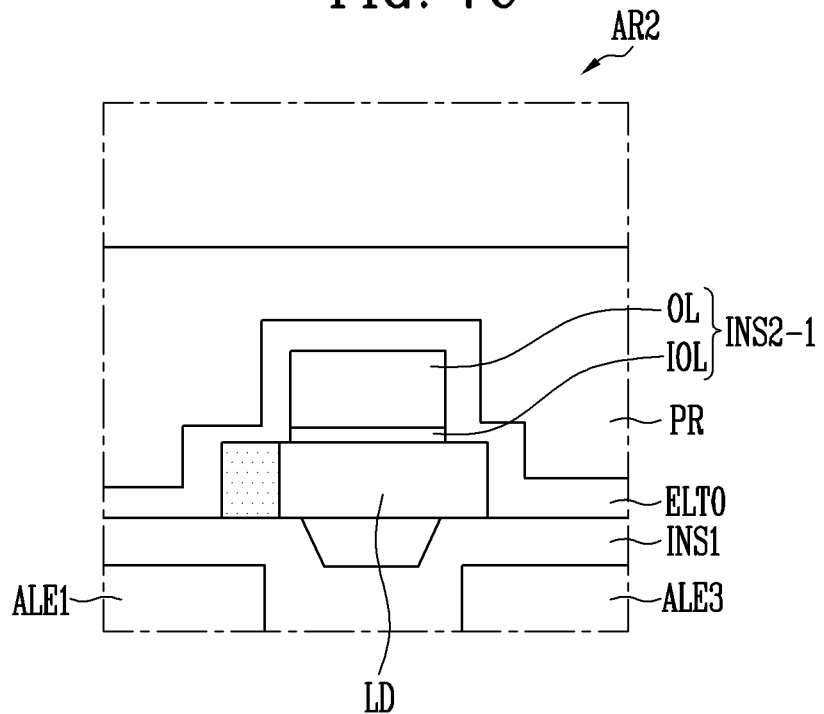

Thereafter, as illustrated in FIG. 7C, to form a mask for selectively etch the conductive layer ELT0, photoresist (or a photoresist layer) PR may be formed on the overall surface of the conductive layer ELT0. The photoresist layer PR may have a sufficient thickness to cover the conductive layer ELT0 even in the other area except area AR2, for example, to cover the conductive layer ELT0 even on protruded components (e.g., the bank BNK) shown in FIG. 6B.

Figure 7D:
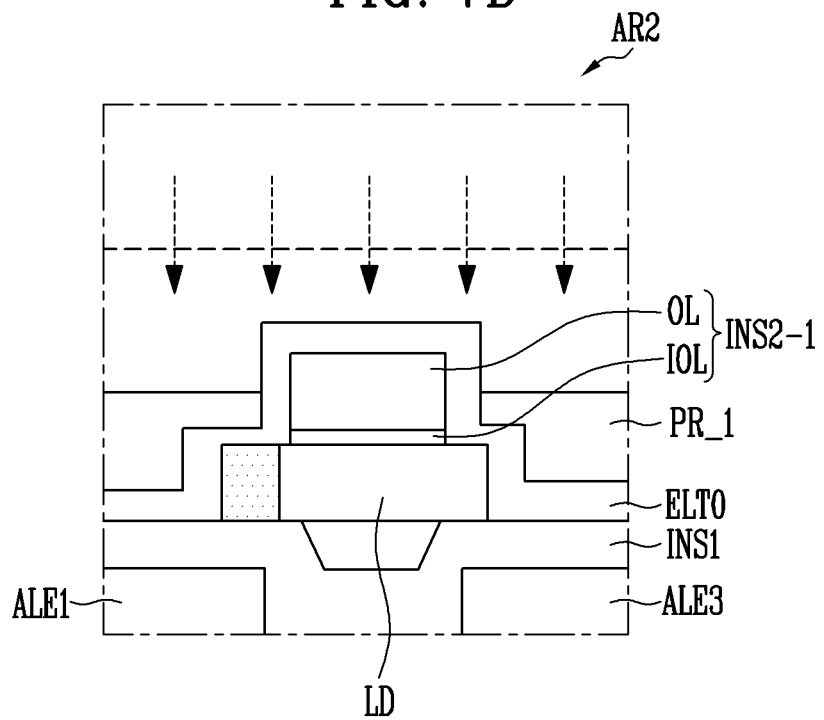

As illustrated in FIG. 7D, a mask PR_1 may be formed by using the halftone mask and exposing the photoresist layer PR. The halftone mask may be applied only to the emission area EA, for example, an area where the light emitting element LD is disposed between the patterns BNP shown in FIGS. 4 and 5A in the emission area EA. A height of a top surface of the mask PR_1 is lower than that of the first insulating pattern INS2-1 based on the first insulating layer INS1 so that the conductive layer ELT0 on the first insulating pattern INS2-1 may be exposed from the mask PR_1.

For reference, the photoresist layer PR on the first insulating pattern INS2-1 may be exposed without using the halftone mask. In this case, an exposure device having a relatively high resolution is needed, and the cost of fabricating the pixel PXL may be increased. In other words, the mask PR_1 may also be formed by an exposure device having a relatively low performance with the halftone mask, so that the cost of fabricating the pixel PXL can be reduced.

Subsequently, the conductive layer ELT0 is etched (e.g., wet-etched) using the mask PR_1, and the mask PR_1 is thereafter removed, whereby the first and third pixel electrodes ELT1 and ELT3 (or the pixel electrodes ELT) shown in FIG. 6A may be formed.

For reference, in an area where all of the patterns BNP, the bank BNK, and the second insulating layer INS2 overlap each other, the corresponding area may protrude higher than the other area. In this case, the photoresist layer PR may not be formed to cover the conductive layer ELT0 in the corresponding area, whereby a short-circuit of the pixel electrode ELT may occur. Alternatively, the thickness of the photoresist layer PR formed in the other area except the corresponding area is excessively increased, whereby fecula of the conductive ELT0 (and an open defect of the pixel electrodes ELT resulting from the fecula) may occur.

FIG. 8A is a plan view illustrating a pixel PXL_C in accordance with a comparative embodiment. FIG. 8A illustrates the pixel PXL_C corresponding to the pixel PXL of FIG. 4. FIG. 8B is a sectional view illustrating the pixel PXL_C, taken along the line VI-VI' of FIG. 8A. FIG. 8B illustrates a conductive layer ELT0 and photoresist layer PR that are formed during a process of fabricating the pixel PXL_C in correspondence with FIG. 7C.

Referring to FIGS. 4, 5A, 7C, 8A, and 8B, the pixel PXL_C of FIG. 8A, other than some shapes of pixel electrodes ELT_C, positions of contact holes CH_C, and a shape of a second insulating layer INS2_C, is similar to the pixel PXL of FIGS. 4 and 5A, so that repetitive explanation thereof will be omitted.

A second insulating layer INS2_C may include a fastener that extends in the second direction DR2 between a first pixel electrode ELT1_C and a third pixel electrode ELT3_C and between a second pixel electrode ELT2_C and a fifth pixel electrode ELT5_C and is configured to fix the light emitting elements LD, and a support that extends or expands in the first direction DR1 from the non-emission area NEA and the split area SPA to prevent the second insulating layer INS2_C from peeling. The support may further include a part extending in the second direction DR2 between the third pixel electrode ELT3_C and the second pixel electrode ELT2_C to secure a sufficient surface area.

The first, second, third, and fifth pixel electrodes ELT1_C, ELT2_C, ELT3_C, and ELT5_C may extend from the emission area EA to the split area SPA in the second direction DR2 in correspondence with the alignment electrodes ALE. In other words, unlike the first, second, third, and fifth pixel electrodes ELT1, ELT2, ELT3, and ELT5 shown in FIG. 4, the first, second, third, and fifth pixel electrodes ELT1_C, ELT2_C, ELT3_C, and ELT5_C each may include only a third part extending substantially in the second direction DR2.

Figure 8B:
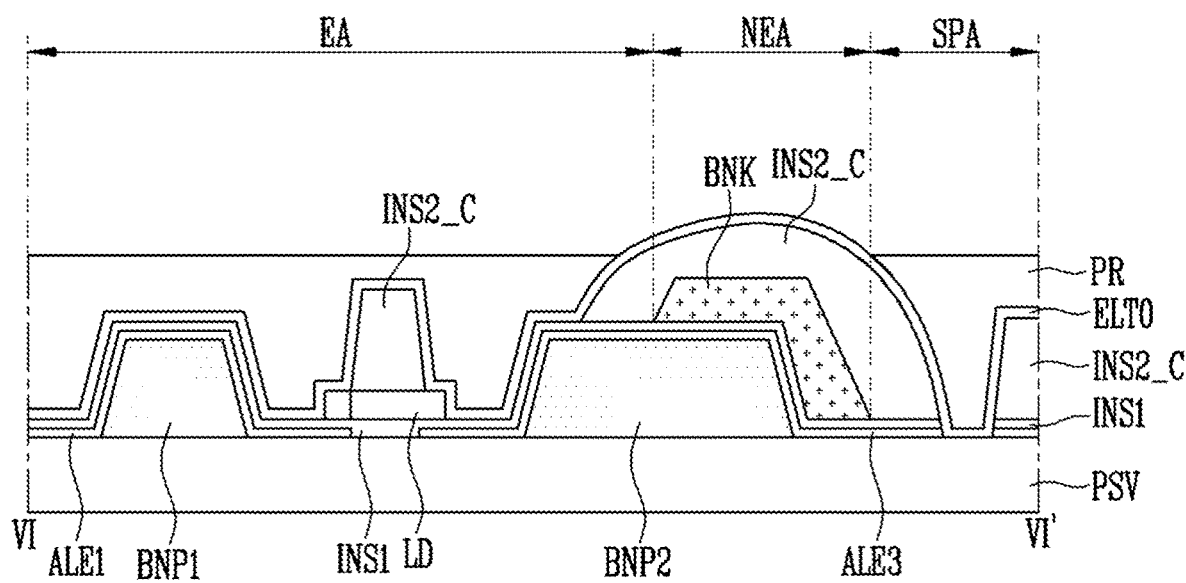
FIG. 8B is a sectional view illustrating the pixel of FIG. 8A, taken along the line VI-VI' of FIG. 8A.

In this case, as illustrated in FIG. 8B, in the non-emission area NEA, all of the second pattern BNP2, the bank BNK, and the second insulating layer INS2_C may overlap each other. Furthermore, a triple organic layer structure including the second pattern BNP2, the bank BNK, and the second insulating layer INS2_C may have a thickness greater than that of other areas. A short-circuit may occur in some of the first, second, third, and fifth pixel electrodes ELT1_C, ELT2_C, ELT3_C, and ELT5_C that overlap the triple organic layer structure.

As described with reference to FIGS. 7B and 7C, the conductive layer ELT0 and the photoresist layer PR may be successively formed on the overall surface of the pixel area PXA to form the pixel electrodes ELT1_C to ELT5_C. In the case where the photoresist layer PR is formed to have a suitable thickness (e.g., a set or predetermined thickness) based on the emission area (for example, an area where the light emitting elements LD are disposed) to which the halftone mask described with reference to FIG. 7C is applied, the photoresist layer PR may not be formed on the triple organic layer structure that relatively protrudes. In other words, the mask may not be formed on the triple organic layer structure, and the conductive layer ELT0 on the triple organic layer structure may be completely removed during the process of etching the conductive layer ELT0. Thus, the third pixel electrode ELT3_C shown in FIG. 8A may be short-circuited in the non-emission area NEA between the emission area EA and the split area SPA. Likewise, in the non-emission area NEA, a short-circuit may occur in each of the first, second, and fifth pixel electrodes ELT1_C, ELT2_C, and ELT5_C. Furthermore, even in the emission area EA, the photoresist layer PR may also not be formed in some area where the second pattern BNP2 and the second insulating layer INS2_C overlap each other. Even in the split area, the photoresist layer PR may also not be formed in some area where the bank BNK and the second insulating layer INS2_C overlap each other.

Although the thickness of the photoresist layer PR may increase to form the photoresist layer PR on the triple organic layer structure, the thickness of the photoresist layer PR in an area such as the split area SPA that does not protrude may excessively increase. Thus, fecula of the conductive layer ELT0, and a short-circuit resulting from the fecula may occur in the pixel electrodes ELT_C.

Therefore, as described with reference to FIGS. 4-6D, only two of the patterns BNP, the bank BNK, and the second insulating layer INS2 may overlap each other, and only a single organic layer (i.e., one of the patterns BNP, the bank BNK, and the second insulating layer INS2) may be disposed under the pixel electrodes ELT. Therefore, a defect (e.g., a short-circuit defect or an open defect resulting from fecula) may be prevented from occurring in the pixel electrodes ELT.

As shown in FIG. 8A, in the pixel PXL_C in accordance with the comparative embodiment, the contact holes CH_C may be disposed on an identical line extending in the first direction DR1. In this case, although the length of the split area SPA with respect to the second direction DR2 may be reduced, as shown in FIG. 8B, a distance with respect to the second direction DR2 from the bank BNK to a contact portion in which the third alignment electrode ALE3 and the conductive layer ELT0 come into contact with each other in the split area SPA may be reduced, and fecula of the conductive layer ELT0 may be caused by a relatively thick photoresist layer PR that is formed in the split area SPA that is relatively narrow.

Therefore, as shown in FIGS. 4 and 5A, the contact holes CH may be alternatively arranged in the first direction. In this case, the distance from the bank BNK to the contact portion with respect to the second direction DR2 may increase. Furthermore, the intervals between the contact holes CH may increase, and a defect (e.g., a short-circuit) resulting from the fecula of the conductive layer ELT0 may be prevented from occurring.

Figure 9A:
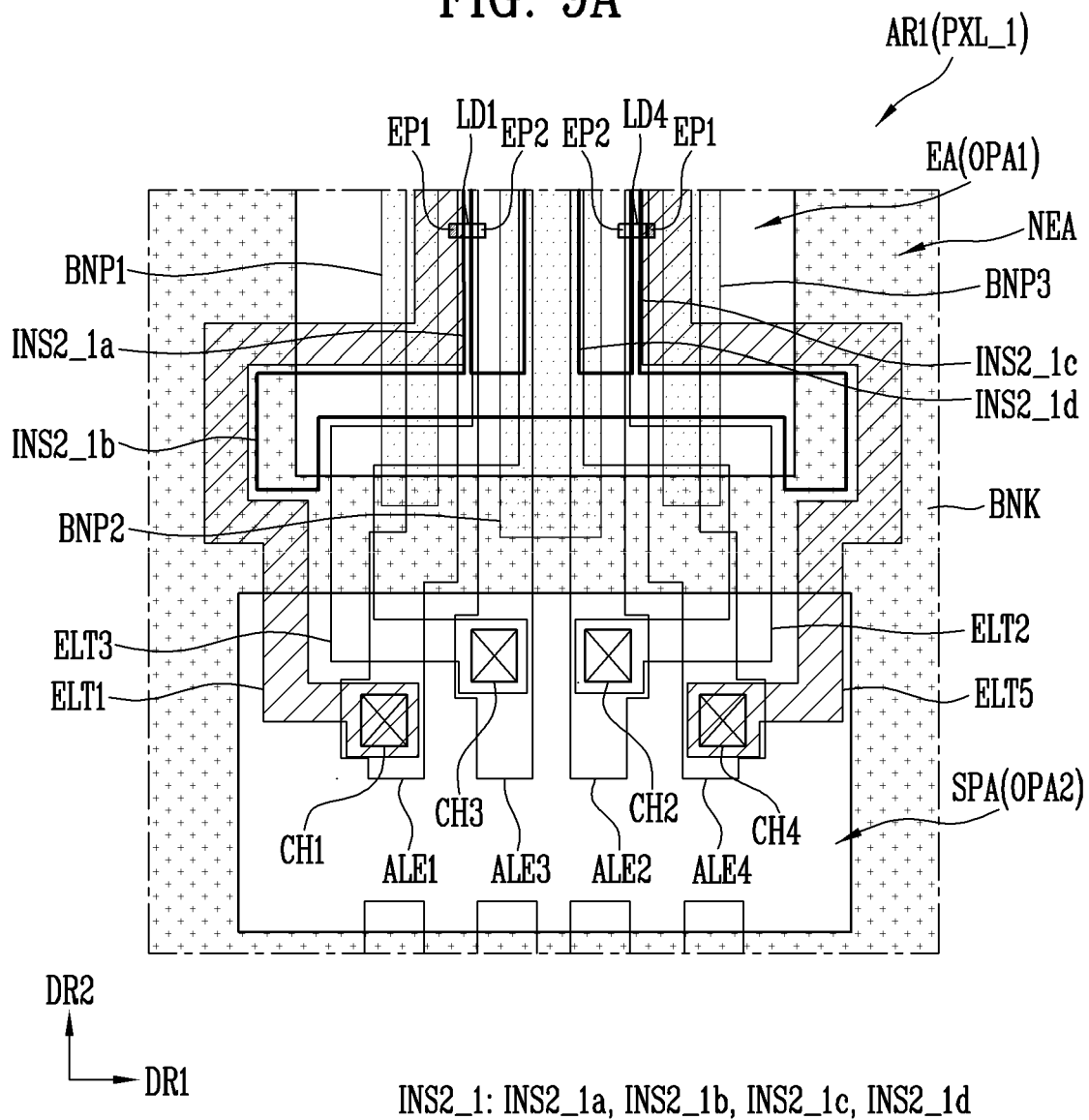
FIGS. 9A and 9B are plan views illustrating a pixel included in the display device of FIG. 2 in accordance with an embodiment.
Figure 9B:
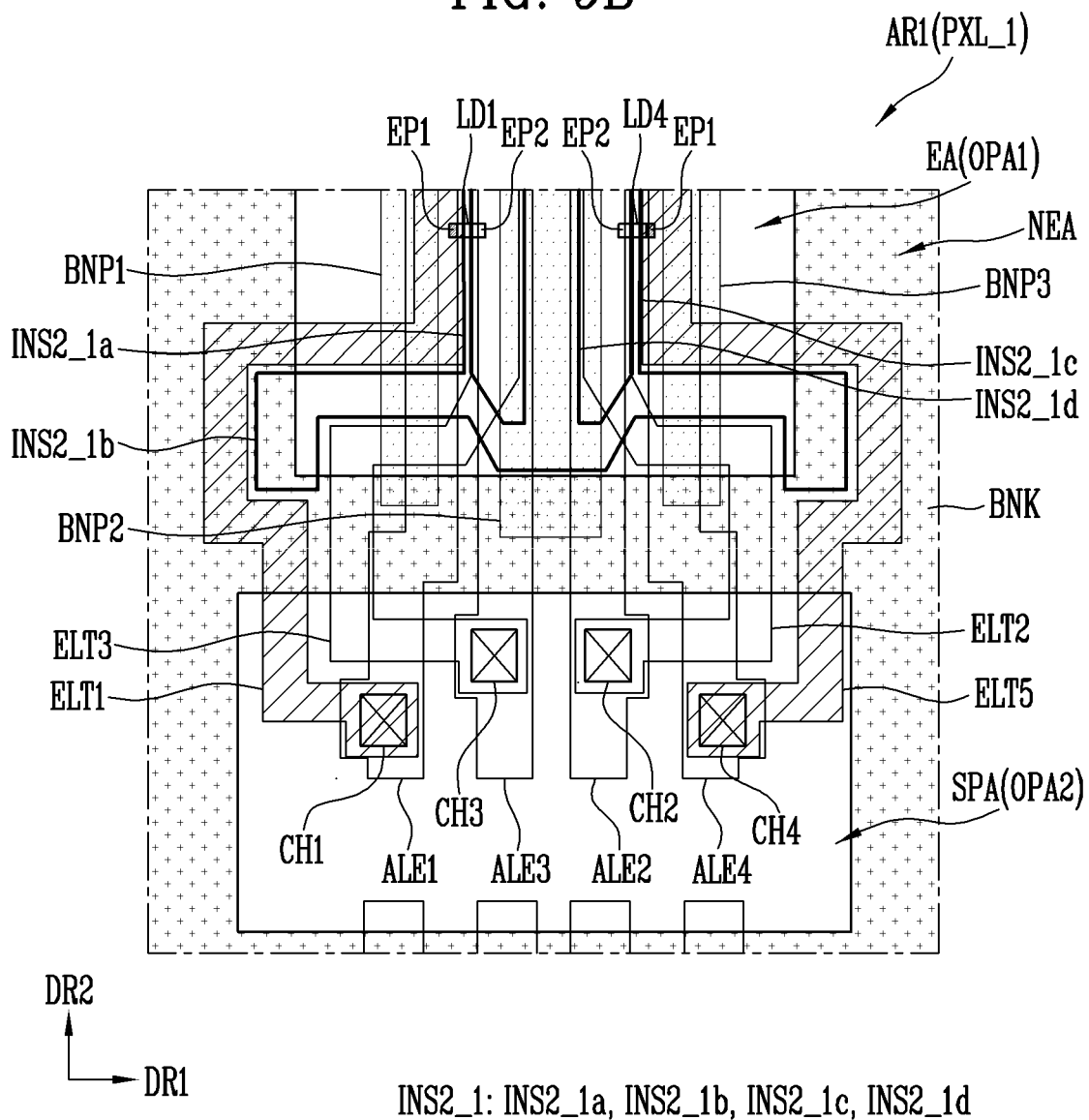

FIGS. 9A and 9B are plan views illustrating a pixel included in the display device of FIG. 2 in accordance with an embodiment. FIGS. 9A and 9B are diagrams corresponding to FIG. 5A.

Referring to FIGS. 2, 3C, 4, 5A, 9A, and 9B, the pixel PXL_1 of FIGS. 9A and 9B other than a plan view shape of a second insulating layer INS2_1 is substantially identical or similar to that of the pixel PXL of FIG. 5A, so that repetitive explanation thereof will be omitted.

The second insulating layer INS2_1 may include first and third parts INS2_1a and INS2_1c (or fasteners) extending in the second direction DR2 between the first and second patterns BNP1 and BNP2 and between the second and third patterns BNP2 and BNP3, respectively, and a second part INS2_1b (or a support) extending from the first and third parts INS2_1a and INS2_1c in the first direction DR1.

As illustrated in FIG. 9B, the first part INS2_1a may be disposed between the first pattern BNP1 and the second pattern BNP2, and have a width (i.e., a width with respect to the first direction DR1) less than the first distance between the first pattern BNP1 and the second pattern BNP2, and may not overlap the first pattern BNP1 and the second pattern BNP2, in a plan view. Likewise, the third part INS2_1c may be disposed between the second pattern BNP2 and the third pattern BNP3 and have a width substantially identical with that of the first part INS2_1a, and may not overlap the second pattern BNP2 and the third pattern BNP3 in a plan view.

The second part INS2_1b may extend from an end of the first part INS2_1a and an end of the third part INS2_1c, respectively, in the first direction DR1, and have a width greater than that of the first part INS2_1a or the third part INS2_1c. The second part INS2_1b may overlap the second pattern BNP2 and couple the first part INS2_1a and the third part INS2_1c. The second part INS2_1b may extend to the non-emission area NEA. In this case, compared to the second insulating layer INS2 (or the second part INS2_1b) shown in FIG. 5A, the surface area (or the length with respect to the first direction DR1) of the second part INS2_1b may increase, and the second insulating layer INS2_1 may be more reliably fixed in place.

In an embodiment, the second insulating layer INS2_1 may further include a fourth part INS2_1d extending in the second direction DR2 between the second pattern BNP2 and the third pattern BNP3. The fourth part INS2_1d may be coupled with the second part INS2_1b, and reliably fix the second insulating layer INS2 along with the second part INS2_1b.

The second insulating layer INS2_1 and the second pattern BNP2 may partially overlap each other, and a portion of the third pixel electrode ELT3 may be disposed on an overlap area where the second insulating layer INS2_1 and the second pattern BNP2 overlap each other. In the case where in the overlap area the second pattern BNP2 has a slant surface inclined at an angle having a suitable range (e.g., a set or predetermined range) or a semicircular cross-section, the maximum height of the second insulating layer INS2_1 (e.g., a sidewall of the second insulating layer INS2_1) in the overlap area may be identical with the height of the top surface of the second insulating layer INS2_1 in a non-overlap area. Therefore, during a process of forming the pixel electrodes ELT using halftone exposure, the portion of the third pixel electrode ELT3 may not be removed.

In an embodiment, as illustrated in FIG. 9B, in a portion adjacent to the overlap area between the second insulating layer INS2_1 and the second pattern BNP2, the third pixel electrode ELT3 may bypass the overlap area by extending the third pixel electrode ELT3 in a diagonal direction or extending the second part INS2_1b of the second insulating layer INS2_1 in a diagonal direction.

As described above, the support (e.g., the second part INS2_1b) of the second insulating layer INS2_1 may extend in the first direction DR1 and may be coupled with the fasteners (e.g., the first part INS2_1a and the third part INS2_1c) of the second insulating layer INS2_1. The support (e.g., the second part INS2_1b) of the second insulating layer INS2_1 has a relatively large surface area, so that the second insulating layer INS2_1 can be more stably fixed in place.

Figure 10:
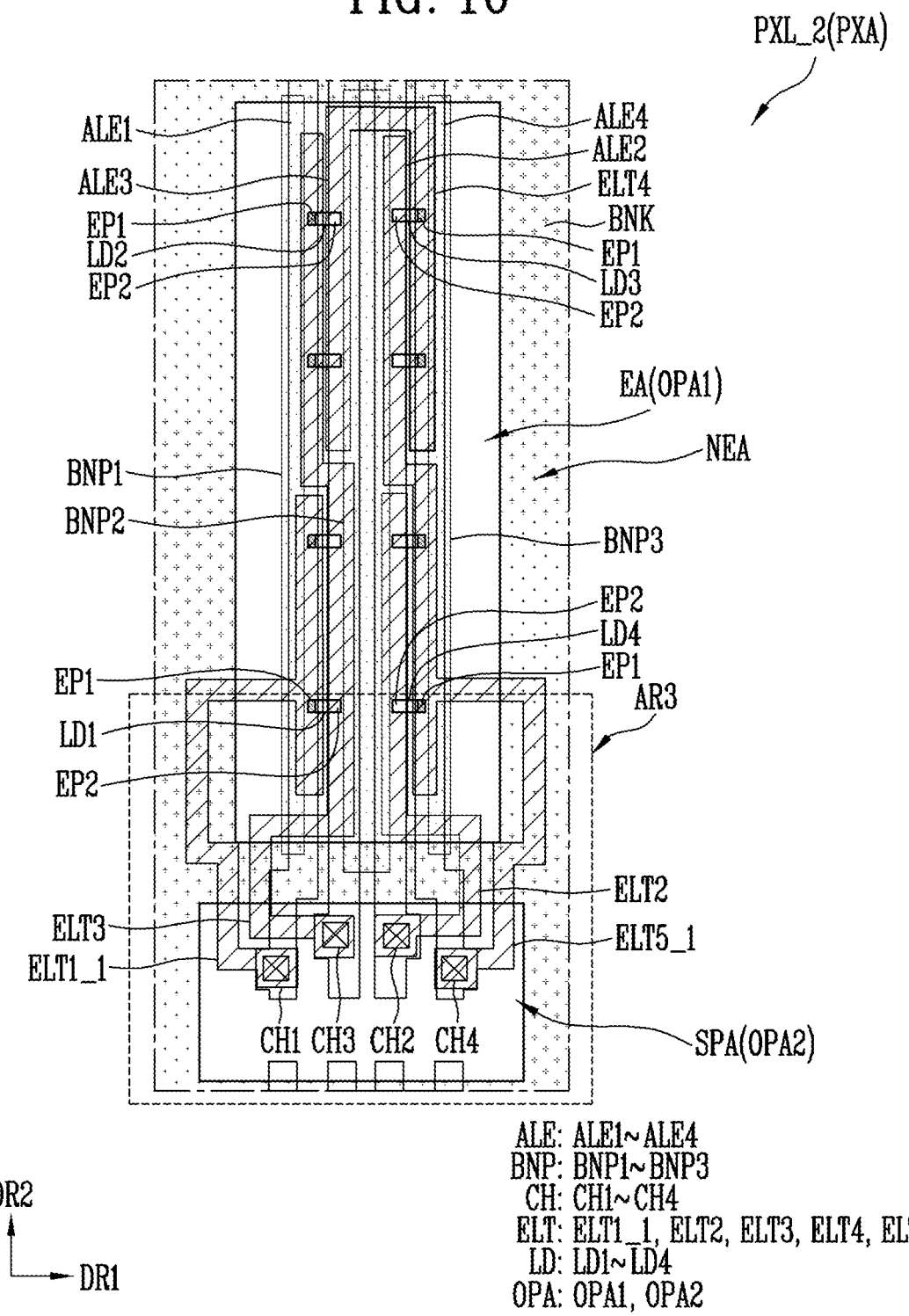
FIG. 10 is a plan view illustrating a pixel included in the display device of FIG. 2 in accordance with an embodiment.
Figure 11:
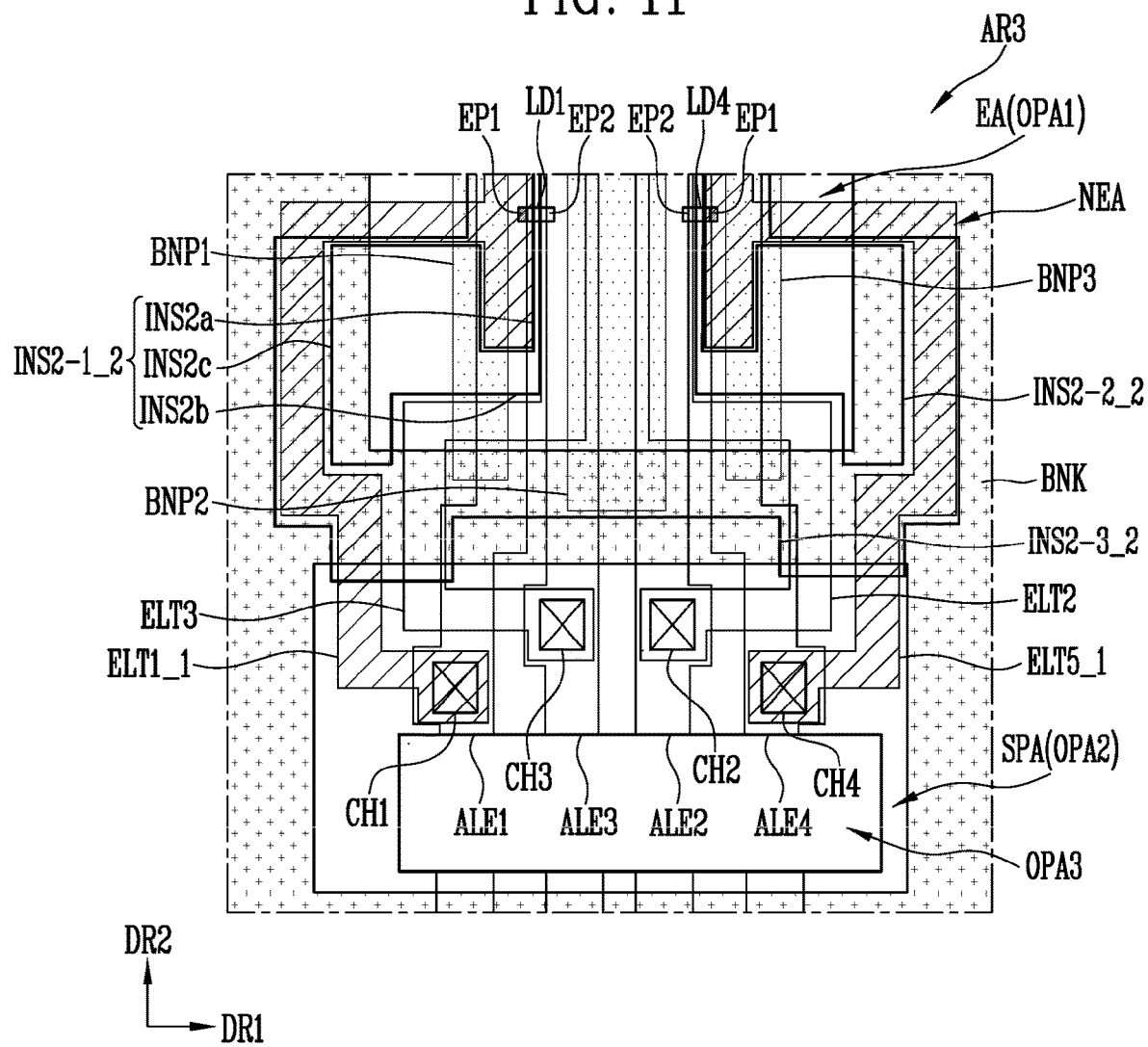
FIG. 11 is an enlarged diagram of an area AR3 of FIG. 10.

FIG. 10 is a plan view illustrating a pixel PXL_2 included in the display device of FIG. 2 in accordance with an embodiment. FIG. 10 is a diagram corresponding to FIG. 4. FIG. 11 is an enlarged diagram of area AR3 of FIG. 10. FIG. 11 is a diagram corresponding to FIG. 5A.

Referring to FIGS. 2, 3C, 4, 5A, 10, and 11, the pixel PXL_2 of FIGS. 10 and 11, other than a plan view shape of a second insulating layer INS2_2 and a plan view shape of first and fifth pixel electrodes ELT1_1 and ELT5_1, is substantially identical or similar to that of the pixel PXL of FIGS. 4 and 5A, so that repetitive explanation thereof will be omitted.

The second insulating layer INS2_2 may include a first insulating pattern INS2-1_2 and a second insulating pattern INS2-2_2.

The first insulating pattern INS2-1_2 may include a first part INS2a (or a fastener) that extends in the second direction DR2 between the first pattern BNP1 and the second pattern BNP2, a second part INS2b (or a first support) that extends from the first part INS2a in the first direction DR1, and a third part INS2c that extends and/or expands from the second part INS2b in the second direction DR2.

As illustrated in FIG. 11, the first part INS2a may be disposed between the first pattern BNP1 and the second pattern BNP2, and have a width (i.e., a width with respect to the first direction DR1) less than the first distance between the first pattern BNP1 and the second pattern BNP2, and may not overlap the first pattern BNP1 and the second pattern BNP2, in a plan view.

The second part INS2b may extend from an end of the first part INS2a in the first direction DR1, and have a width greater than that of the first part INS2a. The second part INS2b may extend to the non-emission area NEA.

The third part INS2c may extend in the second direction DR2 to cover an area between the first pattern BNP1 and the bank BNK that is adjacent to the first pattern BNP1 with respect to the first direction DR1, and may have a width (i.e., a width with respect to the first direction DR1) greater than that of the second part INS2b.

The third part INS2c may partially overlap the first pattern BNP1 and overlap a portion of the bank BNK adjacent to the first pattern BNP1 with respect to the first direction DR1.

Compared to the second insulating layer INS2 (or the second part INS2_1b) shown in FIG. 5A, the total surface area of the second part INS2b and the third part INS2c in FIG. 11 may increase, and the second insulating layer INS2-1_2 may be more reliably fixed in place.

The second insulating pattern INS2-2_2 may be substantially symmetrical with the first insulating pattern INS2-1_2 based on the second pattern BNP2. Hence, description of the second insulating pattern INS2-2_2 will be omitted.

In an embodiment, the second insulating layer INS2_2 may further include a third insulating pattern INS2-3_2. In a manner similar to the third insulating pattern INS2-3 described with reference to FIG. 5A, the third insulating pattern INS2-3_2 may be spaced from the first and second insulating patterns INS2-1_2 and INS2-2_2 by a suitable distance (e.g., a set or predetermined distance) or more.

In an embodiment, as described with reference to FIGS. 9A and 9B, the second part INS2b of the first insulating pattern INS2-1_2 may extend in the second insulating pattern INS2-2_2 and be coupled with the second insulating pattern INS2-2_2. Furthermore, the second insulating layer INS2_2 may further include a fourth part INS2_1d described with reference to FIG. 9A.

The pixel electrodes ELT may extend and bypass the multiple organic layers so that only the single organic layer can be disposed under the pixel electrodes ELT. Here, the multiple organic layers may include two of the patterns BNP, the bank BNK, and the second insulating layer INS2 or be formed of the two.

As illustrated in FIG. 11, the first pixel electrode ELT1_1 may include a third part extending in the second direction DR2 in correspondence with the first part INS2a of the first insulating pattern INS2-1_2, and a fourth part extending while bypassing an overlap area of the third part INS2c (and the second part INS2b) of the first insulating pattern INS2-1_2 and the organic layers (i.e., an overlap area of the third part INS2c and the first pattern BNP1 and an overlap area of the third part INS2c and the bank BNK). The fourth part of the first pixel electrode ELT1_1 may extend, rather than extending from an end of the third part, from a central portion (or a central area) of the third part spaced from the end to the non-emission area NEA in the first direction DR1, and extend to the split area SPA approximately in the second direction DR2 in the non-emission area NEA.

As described above, the second insulating layer INS2 may be more stably fixed by the third part INS2c. Furthermore, the pixel electrodes ELT (e.g., the first pixel electrode ELT1_1) may bypass the multiple organic layers (for example, the third part INS2c of the first insulating pattern INS2-1_2), so that a defect (e.g., an open defect) may be prevented from occurring in the pixel electrodes ELT.

In accordance with embodiments of the present disclosure, only two of patterns, a bank, and a second insulating layer in a pixel may overlap each other, and only a single organic layer (i.e., one of the patterns, the bank, and the insulating pattern) may be disposed under electrodes. In this case, a mask to be used to pattern the electrodes may be normally formed even in an overlap area where the patterns, the bank, and the second insulating layer overlap each other. Furthermore, the electrodes may be prevented from protruding upward to a set height (e.g., a predetermined height) or more. Therefore, during a process of forming the electrodes using a halftone exposure scheme, a defect (e.g., an open defect) may be prevented from occurring in the electrodes.

The aspects and features of the embodiments of the present disclosure are not limited by the foregoing, and other various aspects and features of the embodiments of the present disclose are anticipated herein.

While the spirit and scope of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the present disclosure as defined by the following claims and their equivalents.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

What is claimed is:

1. A pixel comprising:
   an emission area, a non-emission area around the emission area, and a split area spaced from the emission area with the non-emission area interposed therebetween;
   a first pattern and a second pattern spaced from each other in a first direction in the emission area, each of the first pattern and the second pattern extending in a second direction;
   a first light emitting element aligned between the first pattern and the second pattern;
   a first electrode electrically connected to a first end of the first light emitting element;
   a second electrode electrically connected to a second end of the first light emitting element;
   a bank located in the non-emission area and defining the emission area and the split area; and
   an insulating pattern located between the first electrode and the second electrode, the insulating pattern overlapping the first light emitting element in a plan view, wherein in the emission area and the non-emission area, the first electrode and the second electrode come into contact with at least a portion of the insulating pattern, and the first electrode and the second electrode do not overlap the insulating pattern in a plan view.

2. The pixel according to claim 1, wherein the first pattern and the second pattern extend from the emission area to the non-emission area.

3. The pixel according to claim 1, wherein the insulating pattern comprises a first part extending in the second direction between the first pattern and the second pattern, and a second part extending from the first part in the first direction and overlapping one of the first pattern, the second pattern, and the bank.

4. The pixel according to claim 3, wherein, in a plan view, only two of the first pattern, the bank, and the insulating pattern overlap each other.

5. The pixel according to claim 4, wherein, in a plan view, the insulating pattern is spaced from an overlap area where one of the first pattern and the second pattern overlaps the bank.

6. The pixel according to claim 5, wherein, in a plan view, a distance by which the insulating pattern is spaced from the overlap area is greater than a line width of the first electrode.

7. The pixel according to claim 4, wherein, in a plan view, a single organic layer is under each of the first electrode and the second electrode, and
   wherein the single organic layer comprises one of the first pattern, the bank, and the insulating pattern.

8. The pixel according to claim 7, wherein in an area where the insulating pattern overlaps one of the first pattern, the second pattern, and the bank, the insulating pattern is spaced from the first electrode and the second electrode.

9. The pixel according to claim 7, wherein, in a plan view, each of the first electrode and the second electrode extends while bypassing multiple organic layers, and
   wherein the multiple organic layers comprise two of the first pattern, the bank, and the insulating pattern.

10. The pixel according to claim 9, wherein at least one of the first electrode and the second electrode comprises a third part extending in the second direction, and a fourth part extending from an end area of the third part to the non-emission area in the first direction.

11. The pixel according to claim 9, wherein at least one of the first electrode and the second electrode comprises a third part extending in the second direction, and a fourth part extending from a central area of the third part to the non-emission area in the first direction.

12. The pixel according to claim 1, further comprising:
   a first alignment electrode on the first pattern, the first alignment electrode extending in the second direction in the emission area and extending from the emission area to the split area via the non-emission area;
   a second alignment electrode on the second pattern, the second alignment electrode extending in the second direction in the emission area and extending from the emission area to the split area via the non-emission area; and
   a first insulating layer cover overall surfaces of the first and the second alignment electrodes in the emission area, the first insulating layer being interposed between the first and the second alignment electrodes and the first and the second electrodes.

13. The pixel according to claim 12, wherein the first alignment electrode is electrically connected, in the split area, to the first electrode through a first contact hole in the first insulating layer, and wherein the second alignment electrode is electrically connected, in the split area, to the second electrode through a second contact hole in the first insulating layer.

14. The pixel according to claim 12, wherein, in the emission area, the first alignment electrode and the second alignment electrode are spaced from each other by a uniform distance, and each of the first alignment electrode and the second alignment electrode has a uniform width.

15. The pixel according to claim 14, wherein, in the emission area,
the first pattern partially overlaps the first alignment electrode and has a uniform width, and
the second pattern partially overlaps the second alignment electrode, has a uniform width, and is spaced from the first pattern.

16. The pixel according to claim 12, further comprising a second light emitting element aligned between the first pattern and the second pattern.

17. The pixel according to claim 16, further comprising:
a third electrode located between the first electrode and the second electrode and electrically connected between the first and the second electrodes through the first and the second light emitting elements; and
a third alignment electrode between the first alignment electrode and the second alignment electrode, and overlaps one area of the second pattern in a plan view.

18. The pixel according to claim 17, wherein the first electrode overlaps a first area of the first alignment electrode and the first end of the first light emitting element in a plan view, and
wherein the third electrode overlaps a first area of the third alignment electrode, the second end of the first light emitting element, a second area of the first alignment electrode, and a first end of the second light emitting element in a plan view, and has a curved shape.

19. The pixel according to claim 18, wherein the third electrode extends from the emission area to the split area via the non-emission area, and is electrically connected, in the split area, to the third alignment electrode through a third contact hole in the first insulating layer.

20. The pixel according to claim 19, wherein the second pattern overlaps a peripheral area of the bank in a plan view such that the second pattern is in an area between the third electrode and the second electrode in a boundary between the non-emission area and the split area.

21. The pixel according to claim 18, further comprising:
a third pattern facing the first pattern with the second pattern interposed therebetween; and
a fourth alignment electrode on the third pattern, the fourth alignment electrode extending in the second direction in the emission area and extending from the emission area to the split area via the non-emission area.

22. The pixel according to claim 21, further comprising:
a fourth electrode having a curved shape to overlap a second area of the third alignment electrode and a first area of the fourth alignment electrode in a plan view, and electrically connected between the second and the third electrodes; and
a fifth electrode having a curved shape to overlap a first area of the second alignment electrode and a second area of the fourth alignment electrode in a plan view, and electrically connected between the second and the fourth electrodes.

23. The pixel according to claim 22, further comprising:
a third light emitting element aligned between the second pattern and the third pattern, and comprising a first end electrically connected to the fourth electrode, and a second end electrically connected to the fifth electrode; and
a fourth light emitting element aligned between the second pattern and the third pattern, and comprising a first end electrically connected to the fifth electrode, and a second end electrically connected to the second electrode.

* * * * *